(12) United States Patent
Ryu

(10) Patent No.: US 10,211,556 B2
(45) Date of Patent: Feb. 19, 2019

(54) DISPLAY DEVICE

(71) Applicant: LG ELECTRONICS INC., Seoul (KR)

(72) Inventor: Seunghak Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/827,820

(22) Filed: Nov. 30, 2017

(65) Prior Publication Data

US 2018/0097304 A1 Apr. 5, 2018

Related U.S. Application Data

(63) Continuation of application No. 15/179,372, filed on Jun. 10, 2016, now Pat. No. 9,837,739.

(30) Foreign Application Priority Data

Nov. 12, 2015 (KR) .................. 10-2015-0158785
Dec. 16, 2015 (KR) .................. 10-2015-0180078

(51) Int. Cl.
*H01R 12/77* (2011.01)
*H01R 13/62* (2006.01)
*H01R 12/81* (2011.01)
*H05K 1/11* (2006.01)
(Continued)

(52) U.S. Cl.
CPC .......... *H01R 12/774* (2013.01); *H01R 12/81* (2013.01); *H01R 13/6205* (2013.01); *H05K 1/118* (2013.01); *H05K 1/0298* (2013.01); *H05K 3/361* (2013.01); *H05K 2201/058* (2013.01); *H05K 2201/09845* (2013.01)

(58) Field of Classification Search
CPC .......................... H01R 12/774; H01R 13/6205
USPC ........................................ 439/39; 174/117 F
See application file for complete search history.

(56) References Cited

U.S. PATENT DOCUMENTS

| 4,229,615 | A | 10/1980 | Orr |
|---|---|---|---|
| 6,769,609 | B2 | 8/2004 | Ono et al. |
| 6,953,888 | B2 | 10/2005 | Livshitz et al. |

(Continued)

FOREIGN PATENT DOCUMENTS

| CN | 101752740 A | 6/2010 |
|---|---|---|
| CN | 203026652 A | 6/2013 |

(Continued)

OTHER PUBLICATIONS

International Search Report and Written Opinion dated Sep. 26, 2016 for International Patent Application No. PCT/KR2016/005768, 13 pages.

*Primary Examiner* — Timothy J Thompson
*Assistant Examiner* — Charles Pizzuto
(74) *Attorney, Agent, or Firm* — Dentons US LLP

(57) ABSTRACT

A display device is disclosed. The display device includes a body, a housing separated from the body and configured to transmit/receive signals to/from the body, and a cable coupling the housing and the body, wherein the cable includes a flat cable located in at least part of the cable and having a flat shape, and a round cable located in at least another part of the cable and having a round shape. According to the present invention, the flat cable has a narrow width by including a plurality of layers, and thus wiring of signal terminals and power terminals can be easily changed between the flat cable and the round cable.

15 Claims, 39 Drawing Sheets

(51) Int. Cl.
  *H05K 1/02*   (2006.01)
  *H05K 3/36*   (2006.01)

(56)           References Cited

U.S. PATENT DOCUMENTS

| | | |
|---|---|---|
| 8,916,774 B2 | 12/2014 | Richards et al. |
| 2004/0094324 A1 | 5/2004 | Barr et al. |
| 2004/0163833 A1 | 8/2004 | Livshitz et al. |
| 2005/0136703 A1 | 6/2005 | Van Schuylenbergh et al. |
| 2007/0258011 A1* | 11/2007 | Tachikawa ......... H04N 5/44582 348/569 |
| 2008/0220626 A1 | 9/2008 | Yeh |
| 2012/0163645 A1 | 6/2012 | Hwang et al. |
| 2013/0292171 A1 | 11/2013 | Richards et al. |
| 2015/0309550 A1* | 10/2015 | Shirakami ............ G09G 3/3696 713/300 |
| 2016/0227157 A1* | 8/2016 | Zhong ..................... G09G 5/18 |
| 2016/0295713 A1* | 10/2016 | Hwang .................... H05K 5/02 |
| 2017/0034936 A1* | 2/2017 | Min ...................... F16M 11/04 |

FOREIGN PATENT DOCUMENTS

| | | |
|---|---|---|
| CN | 203631153 A | 6/2014 |
| WO | 2007/117060 A2 | 10/2007 |

\* cited by examiner

FIG. 9
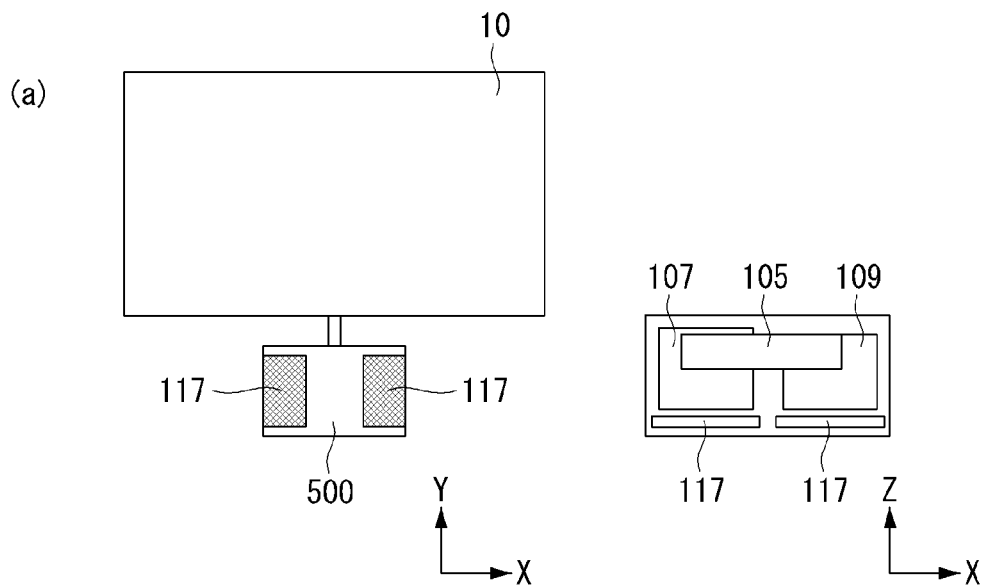
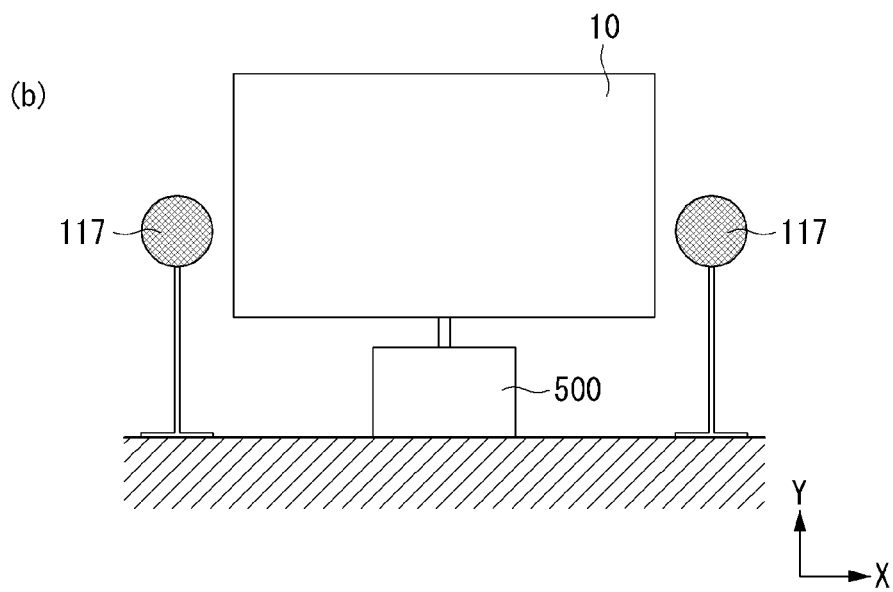

FIG. 17
(a) 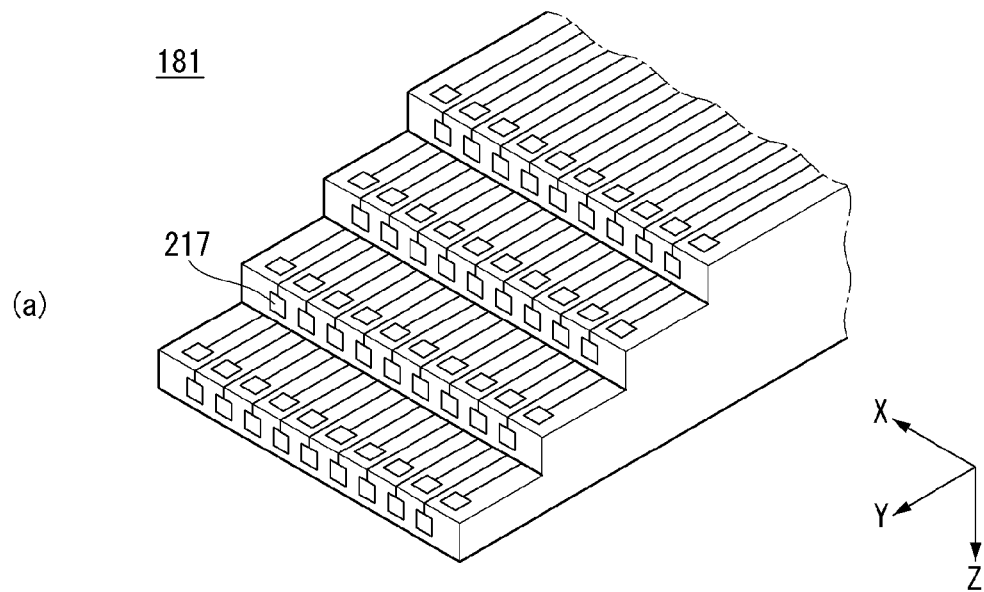
(b) 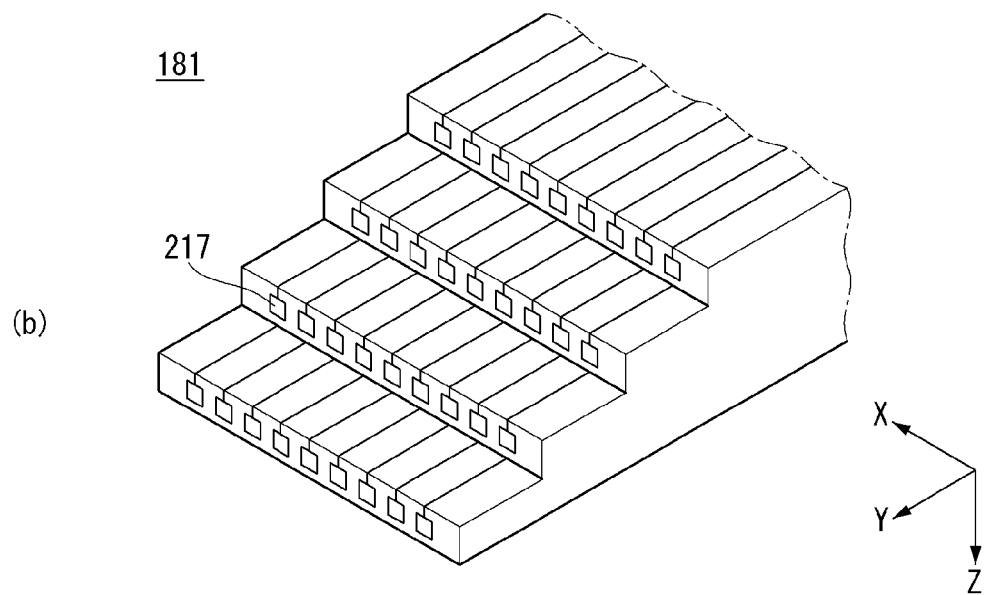

FIG. 18
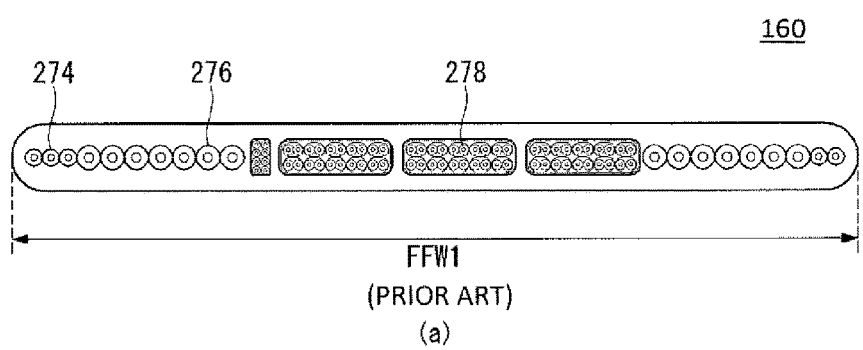
FFW1
(PRIOR ART)
(a)
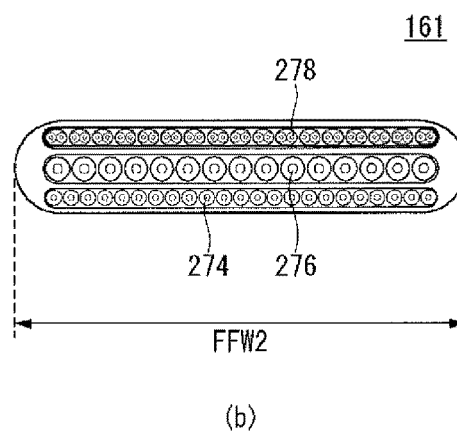
FFW2
(b)

FIG. 19
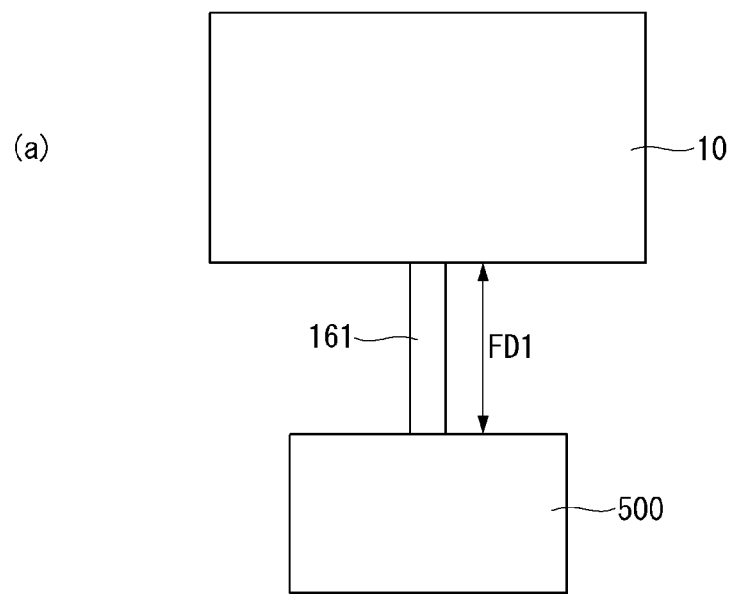
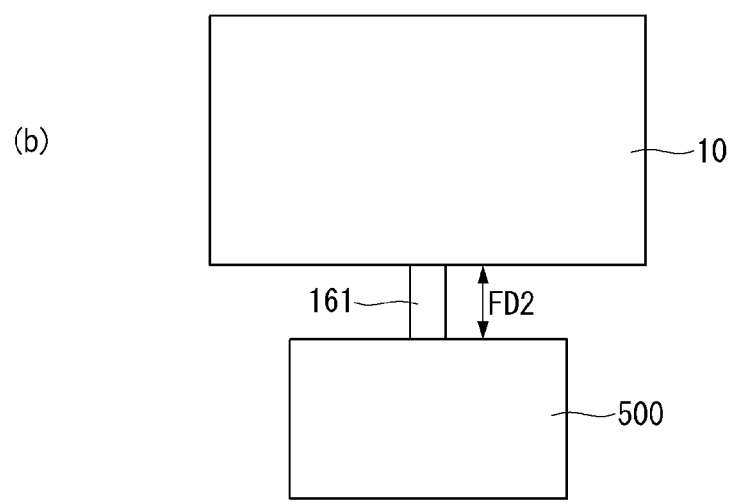

FIG. 20
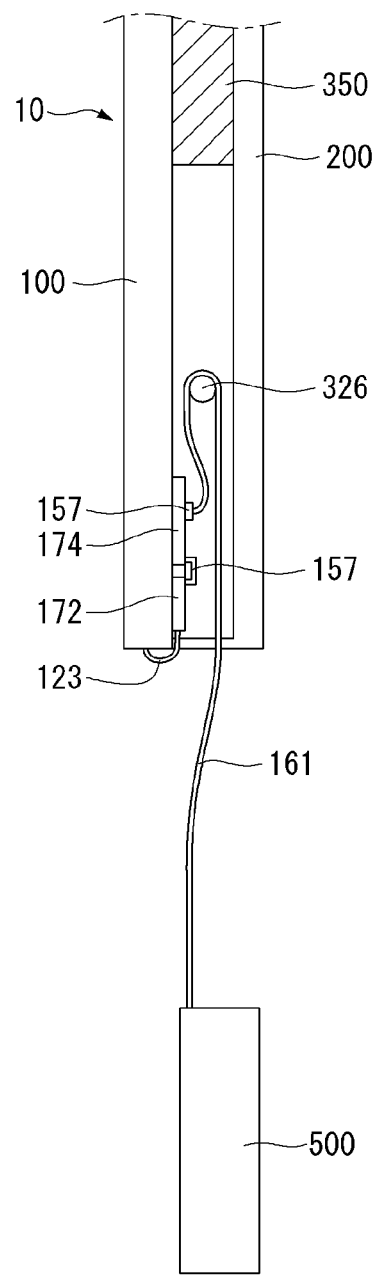
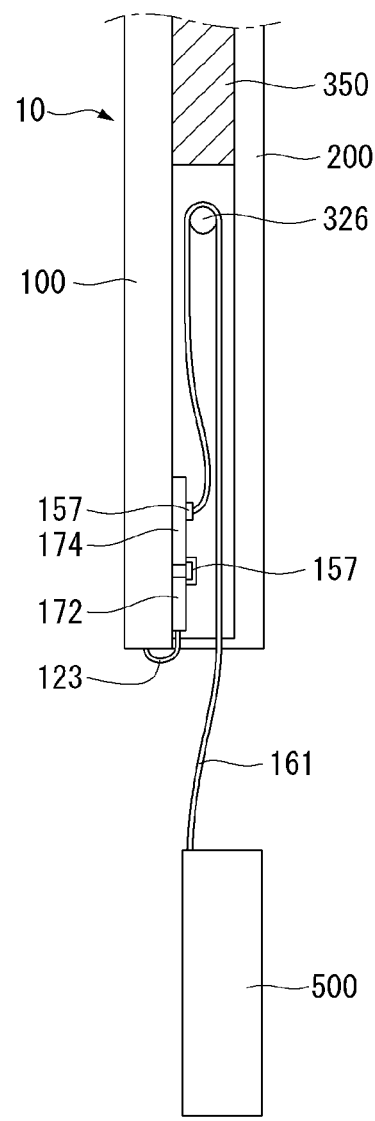

FIG. 21
(a)
(b)
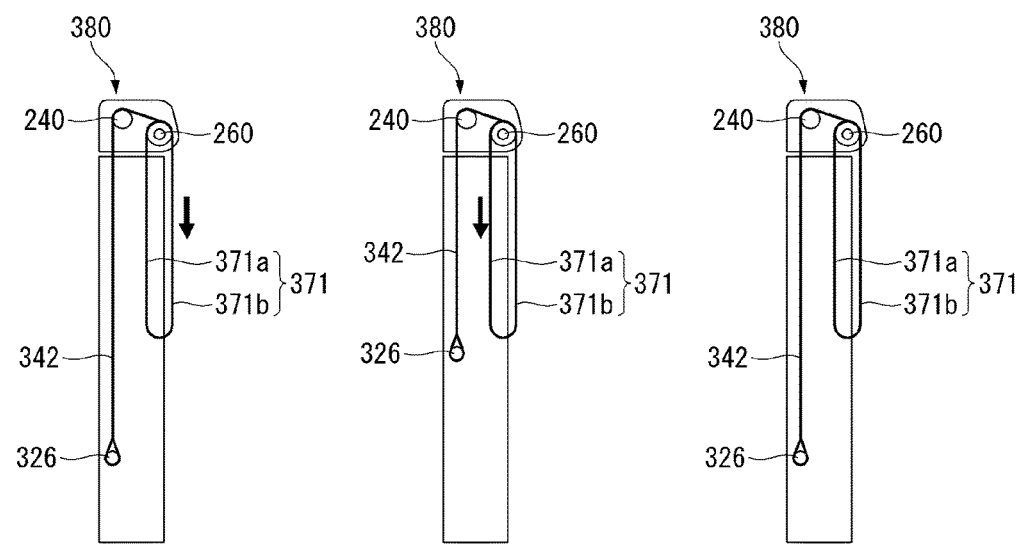

FIG. 29
(a)
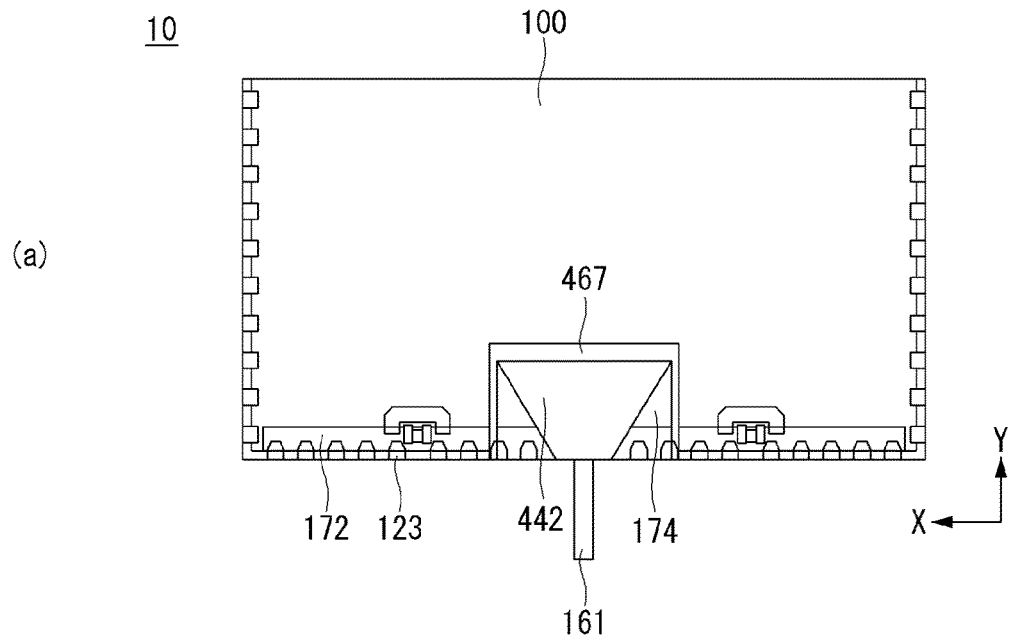
(b)
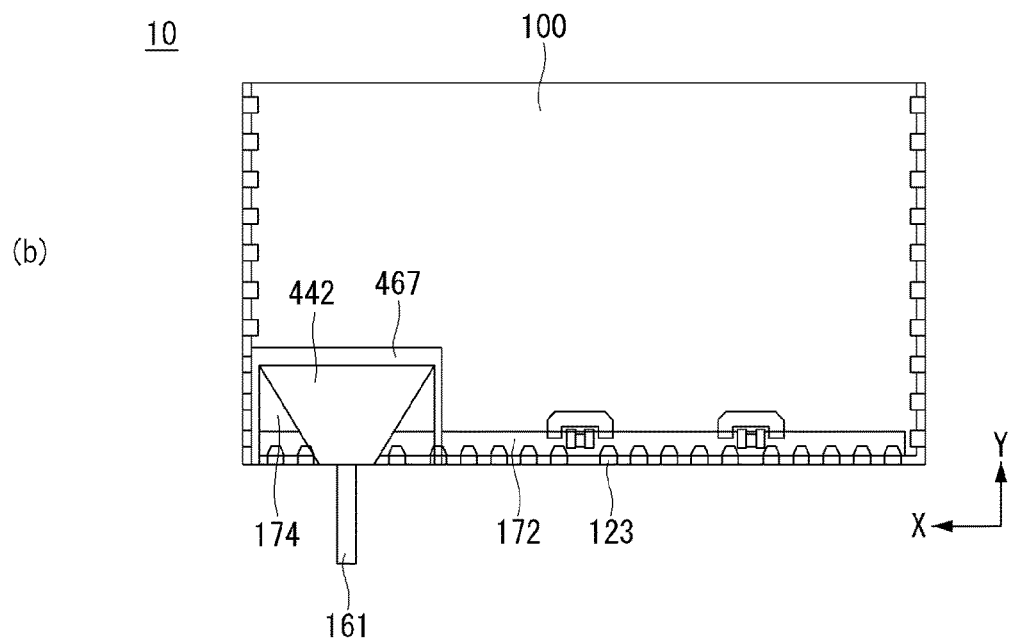

FIG. 32
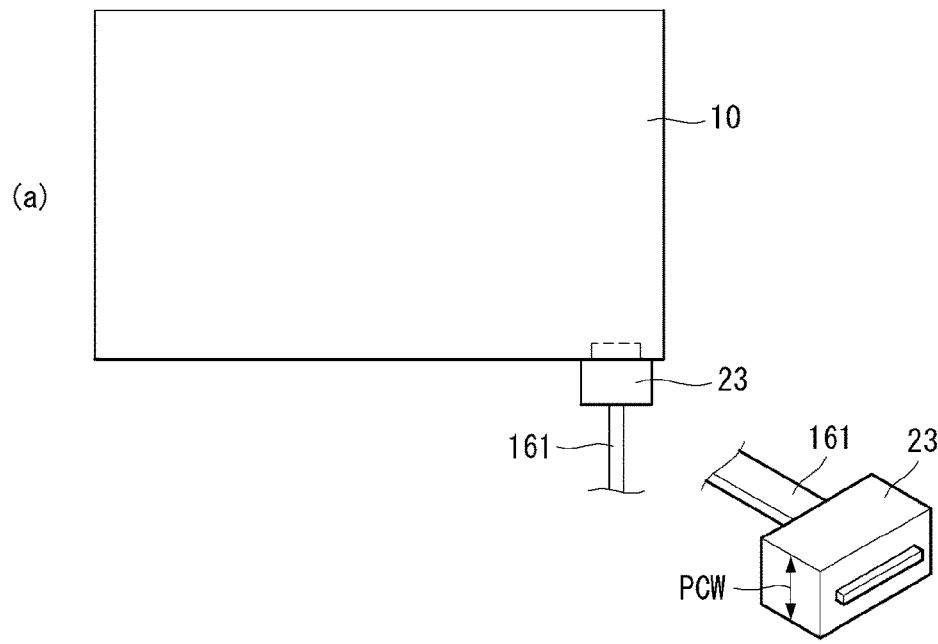
(a)
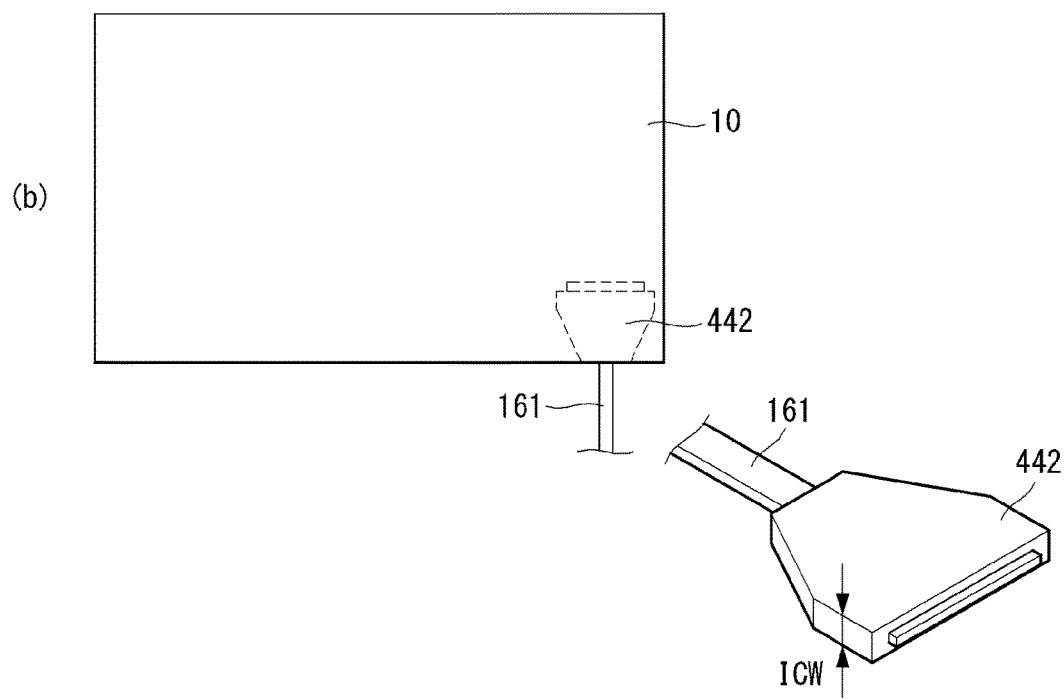
(b)

DISPLAY DEVICE

This application is a continuation of U.S. patent application Ser. No. 15/179,372, filed on Jun. 10, 2016, which claims the benefit of Korean Application Nos. 10-2015-0158785 filed on Nov. 12, 2015, and 10-2015-0180078 filed on Dec. 16, 2015, all of which are hereby incorporated by reference in its entirety.

BACKGROUND OF THE DISCLOSURE

Field of the Disclosure

The preset invention relates to a display device and, more particularly, to a display device configured in such a manner that a flat cable can be easily coupled to/separated from an FPC cable since a cable cover for shielding the flat cable is not present.

Background of the Disclosure

With the development of information-oriented society, demand for display devices is increasing. To meet such demand, various types of display devices such as an LCD (Liquid Crystal Display), PDP (Plasma Display Panel), ELD (electroluminescent display) and VFD (Vacuum Fluorescent Display) have recently been researched and used.

From among such display devices, display devices using an organic light emitting diode (OLED) can be implemented as ultra-thin displays since the display devices have excellent luminance and viewing angle characteristics and do not require a backlight unit, compared to LCDs.

SUMMARY OF THE DISCLOSURE

According to one aspect of the present invention, there is provided a display device, including: a body; a housing separated from the body and configured to transmit/receive signals to/from the body; and a cable coupling the housing and the body, wherein the cable includes a flat cable located in at least part of the cable and having a flat shape, and around cable located in at least another part of the cable and having a round shape.

The flat cable may include a plurality of layers.

The flat cable may have one end coupled to the body, and the round cable may have one end coupled to the housing.

The display device may further include an FPC cable coupling the other end of the flat cable and the other end of the round cable.

At least one of the plurality of layers may include a signal terminal through which signals are transferred, and at least another one of the plurality of layers may include a power terminal through which power is supplied.

A layer between the signal terminal and the power terminal may include a ground terminal.

The length of a protruding end of at least one of the plurality of layers may differ from that of at least another one of the plurality of layers.

The uppermost layer, from among the plurality of layers, may have a longest protruding length and layers under the uppermost layer may have identical or shorter protruding lengths with increasing distance from the uppermost layer.

The FPC cable may include a plurality of layers corresponding to the plurality of layers of the flat cable.

Protruding ends of the layers of the FPC cable may have different lengths.

The lowermost layer, from among the plurality of layers of the FPC cable, may have a longest protruding length and layers above the lowermost layer may have identical or shorter protruding lengths with increasing distance from the lowermost layer.

The FPC cable may include one or more FPC terminals disposed on the upper surface of the end of each layer, wherein the FPC terminals are arranged at intervals.

The FPC cable may include FPC terminals disposed on the upper surface of the end of each layer and the front side of each layer.

The FPC terminals disposed on the upper surface of the end of each layer and the FPC terminals disposed on the front side of each layer may be alternately arranged in a zigzag form.

One of at least one side of the FPC cable and a side connected to the at least one side may have a stepped form.

The FPC cable may include an FPC terminal disposed at the end thereof, and the FPC terminal may be provided to one of at least one side of the FPC cable and a side connected to the at least one side.

At least one side of the FPC cable and both sides connected to the one side may have a stepped form.

The FPC cable may include an FPC terminal disposed at the end thereof, and the FPC terminal may be provided to at least one side of the FPC cable and both sides connected to the at least one side.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1 to 10 illustrate a configuration of a display device according to the present invention;

FIGS. 11 to 18 illustrate a connecting part of a display device body and a housing according to an embodiment of the present invention;

FIGS. 19, 20 and 21 illustrate a display device according to an embodiment of the present invention; and FIGS. 22 to 39 illustrate a display device according to another embodiment of the present invention.

DETAILED DESCRIPTION OF THE EMBODIMENTS

Figure 1:
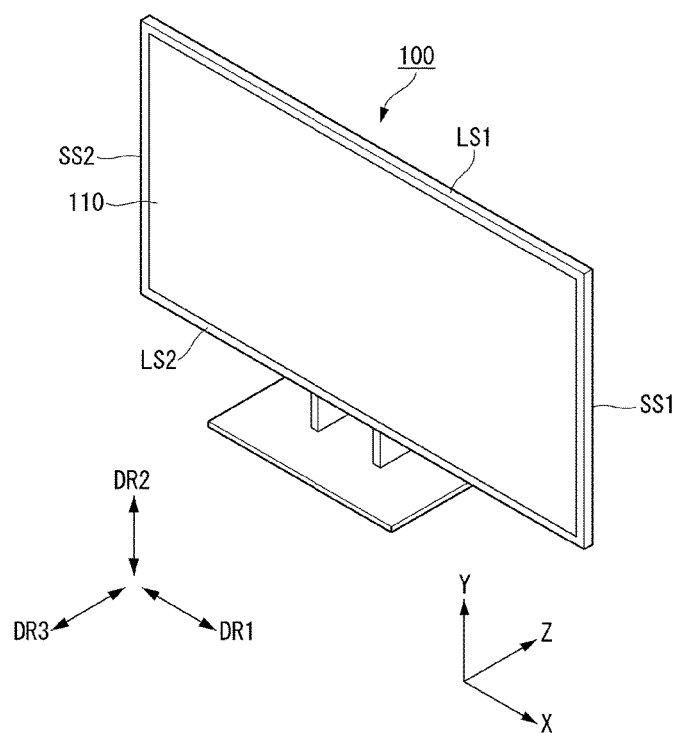

Reference will now be made in detail to embodiments of the invention examples of which are illustrated in the accompanying drawings. Since the present invention may be modified in various ways and may have various forms, specific embodiments are illustrated in the drawings and are described in detail in the present specification. However, it should be understood that the present invention is not limited to specific disclosed embodiments, but includes all modifications, equivalents and substitutes within the spirit and technical scope of the present invention.

The terms "first", "second", etc. maybe used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as being "connected to" or "linked to" another component, this should be understood to mean that additional component(s) may exist therebetween, although the arbitrary component may be directly connected to, or linked to, the second component. In contrast, when an arbitrary component is described as being "directly connected to" or "directly linked to" another component, this should be understood to mean that no component exists therebetween.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meaning as generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

While an organic light emitting display (OLED) is exemplified as a display panel in the following description, a display panel applicable to the present invention is not limited to the OLED panel and may be an LCD, PDP or FED (Field Emission Display) panel.

FIGS. 1 to 10 illustrate a configuration of a display device according to the present invention.

Referring to FIG. 1, a display panel 100 may include a first long side LS1, a second long side LS2, a first short side SS1 adjoining the first long side LS1 and the second long side LS2, and a second short side SS2 opposite the first short side SS1.

The area of the first short side SS1 may be referred to as a first side area, the area of the second short side SS2 may be referred to as a second side area, the area of the first long side LS1 may be referred to as a third side area adjoining the first side area and the second side area and located between the first side area and the second side area, and the area of the second long side LS2 may be referred to as a fourth side area opposite the third side area, which adjoins the first side area and the second side area and is located between the first side area and the second side area.

While the length of the first and second long sides LS1 and LS2 is greater than the length of the first and second short sides SS1 and SS2 in the figure, the length of the first and second long sides LS1 and LS2 may be approximately equal to the length of the first and second short sides SS1 and SS2.

In the following description, a first direction DR1 may be parallel with the long sides LS1 and LS2 of the display panel 100 and a second direction DR2 may be parallel with the short sides SS1 and SS2 of the display panel 100.

A third direction DR3 may be perpendicular to the first direction DR1 and/or the second direction DR2.

The first direction DR1 and the second direction DR2 may be commonly referred to as a horizontal direction.

The third direction DR3 may be referred to as a vertical direction.

Figure 2:
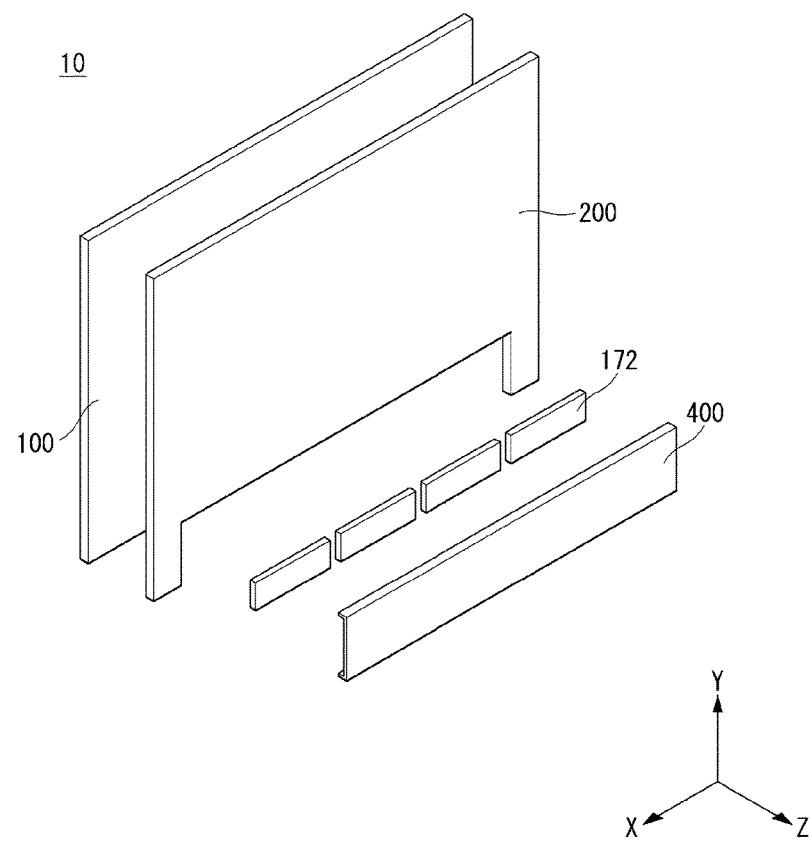

Referring to FIG. 2, a display device body 10 according to the present invention may include the display panel 100, a module cover 200 and a PCB cover 400.

The display panel 100 is provided to the front side of the body 10 and displays images. The display panel 100 may divide an image into a plurality of pixels and display the image by controlling color, brightness and saturation per pixel.

The display panel 100 may have a rectangular shape. However, the shape of the display panel 100 is not limited thereto and the display panel 100 may have corners with a predetermined curvature. The display panel 100 may be an OLED panel. However, the display panel 100 is not limited thereto and may be an LCD panel.

The module cover 200 may be provided to the rear side of the display panel 100. The module cover 200 may be directly attached to the display panel 100. The module cover 200 can support the rear side of the display panel 100. That is, the module cover 200 can reinforce the display panel 100. Accordingly, the module cover 200 may be formed of a material that is light and has high hardness. For example, the module cover 200 can be formed of aluminum.

A source PCB 172 may be attached to the lower part of the module cover 200. The module cover 200 may have a hole formed in a region where the source PCB 172 is disposed. When an excessively large number of through-holes or holes are formed in the module cover 200, the module cover 200 may be cracked or the hardness thereof may decrease. Accordingly, it is desirable that the module cover 200 have a fewer through-holes or holes.

The source PCB 172 may have signal lines mounted thereon. The signal lines transfer digital video data and timing control signals transmitted from a timing controller board. The source PCB 172 can be connected to the display panel 100 through a source COF (Chip on Film).

The source COF can be electrically connected to the source PCB 172 and data pads of the display panel 100. The source COF may have a data integrated circuit mounted thereon.

The PCB cover 400 may be provided to the region where the source PCB 172 is disposed. The PCB cover 400 can prevent the source PCB 172 from being exposed. The PCB cover 400 may be opaque such that the source PCB 172 is not exposed.

The PCB cover 400 may be formed of an insulating material such that interference from other electronic devices is not applied to the source PCB 172. For example, the PCB cover 400 can be formed of a plastic material. Accordingly, the PCB cover 400 can protect the source PCB 172 from leakage current.

The display device body according to the present invention can support the display panel 100 only with the module cover 200. That is, the body 20 may not include a cover other than the module cover 200. Accordingly, a user can feel that the body 10 is thin and concentrate on the display screen.

Figure 3:
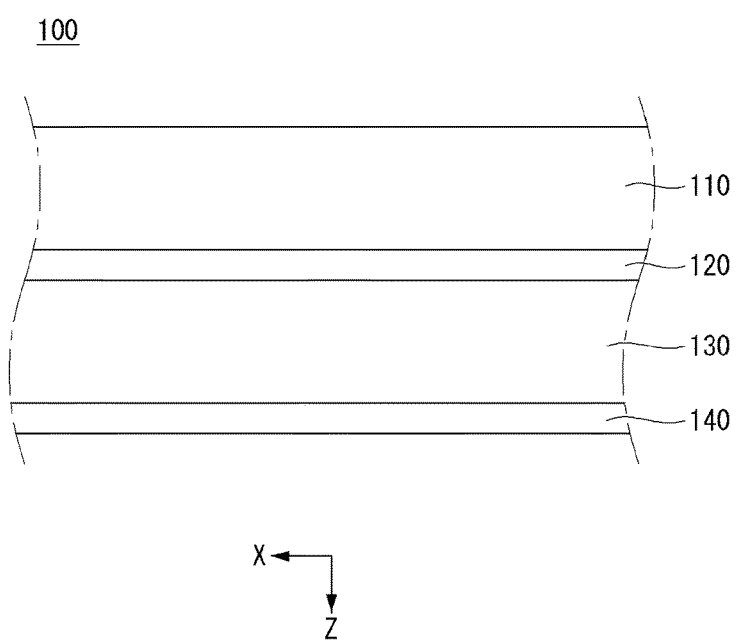

Referring to FIG. 3, the display panel 100 may include a transparent substrate 110, an upper electrode 120, an organic emission layer 130 and a lower electrode 140. The transparent substrate 110, the upper electrode 120, the organic emission layer 130 and the lower electrode 140 may be sequentially formed.

The transparent substrate 110 and the upper electrode 120 may contain a transparent material. The lower electrode 140 may contain a material that is not transparent. However, the material of the lower electrode 140 is not limited thereto and may include a transparent material (e.g. ITO). In this case, light can be emitted from one side of the lower electrode 140.

When a voltage is applied to the upper and lower electrodes 120 and 140, light emitted from the organic emission layer 130 can be projected to the outside through the upper electrode 120 and the transparent substrate 110. Here, to project light emitted from the lower electrode 140 to the front of the display panel 100, a light shielding plate may be provided behind the lower electrode 140.

The display device according to the present invention may be an OLED display. Accordingly, the display device 100 does not require an additional light source and the volume and weight of the display device 100 can be reduced. In addition, the OLED display has a response speed 1000 times that of an LCD, afterimage is not generated when the OLED display displays images.

Figure 4:
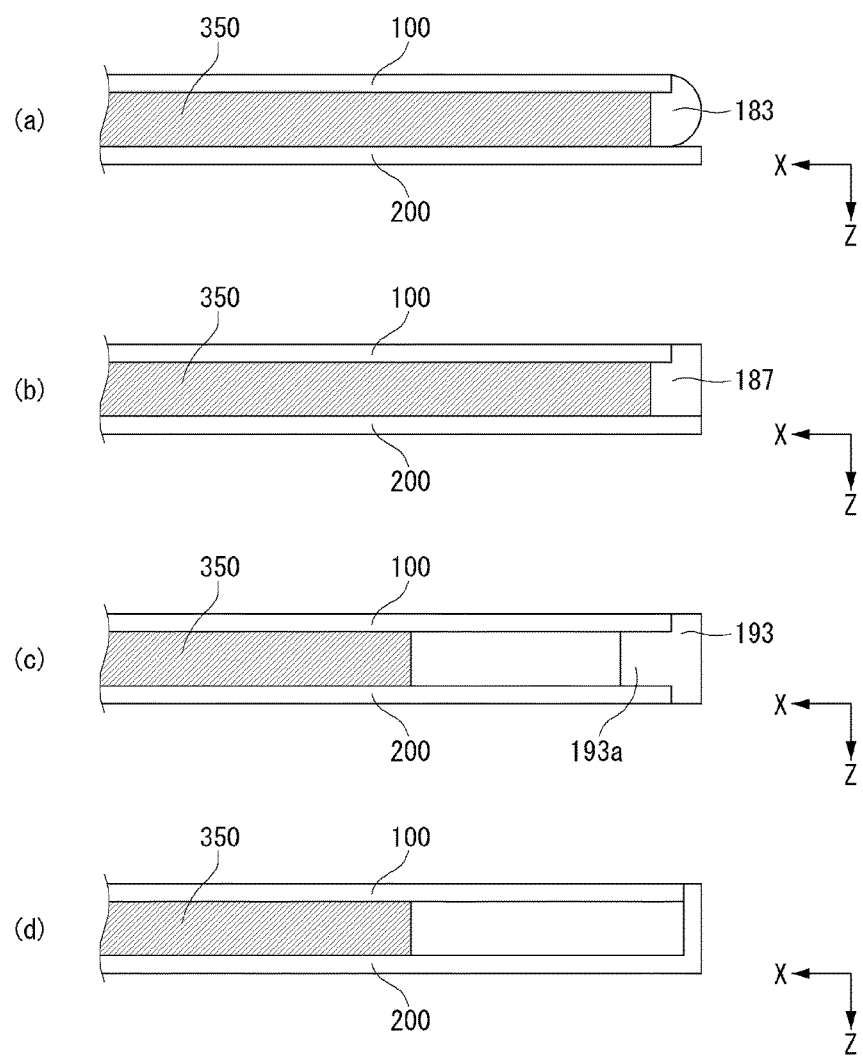

Referring to FIG. 4, in the display device according to the present invention, the back cover 200 can be attached to the display panel 100 through an adhesive sheet 350. The adhesive sheet 350 may include a double-sided tape.

The adhesive sheet 350 may have a thickness. Accordingly, particles or dust may enter the space between the display panel 100 and the back cover 200. To prevent this, at least one side of the adhesive sheet 350 may be sealed using a sealing member 183, as shown in FIG. 4(a). The sealing member 183 can simultaneously shield at least one side of the adhesive sheet 350 and at least one side of the display panel 100.

Alternatively, a frame 187 may be provided to at least one side of the adhesive sheet 350, as shown in FIG. 4(b). The frame 187 comes into contact with at least one side of the adhesive sheet 350 and one end thereof maybe bent to extend to the display panel 100. Accordingly, the frame 187 can also shield at least one side of the display panel 100.

Alternatively, a middle cabinet 193 may be provided between the display panel 100 and the back cover 200, as shown in FIG. 4(c). The middle cabinet 193 can guide a position to which the display panel 100 is coupled. The middle cabinet 193 may have a flange 193a inserted between the display panel 100 and the back cover 200. The body of the middle cabinet 193 can simultaneously shield at least one side of the display panel 100 and at least one side of the back cover 200.

The flange 193a of the middle cabinet 193 may be separated from the adhesive tape 350. Accordingly, the adhesive sheet 350 need not be applied to the entire area of the display panel 100, and thus the quantity of the adhesive sheet 350 can be reduced when the display device is manufactured.

Alternatively, the edge of the back cover 200 may be bent to the display panel 100, as shown in FIG. 4(d). Since the edge of the back cover 200 is bent, at least one side of the adhesive sheet 350 can be shielded.

In this case, particles can be prevented from entering between the display panel 100 and the back cover 200. Accordingly, a display device manufacturing process can be simplified and manufacturing costs can be decreased. In addition, the edge of the back cover 200 can be separated from the adhesive sheet 350. Accordingly, the adhesive sheet 350 need not be applied to the entire area of the display panel 100, and thus the quantity of the adhesive sheet 350 can be reduced when the display device is manufactured.

In the following embodiments, structures provided to at least one side of the adhesive tape 350 are omitted for convenience of description. The structures provided to at least one side of the adhesive tape 350 are applicable to other embodiments.

Figure 5:
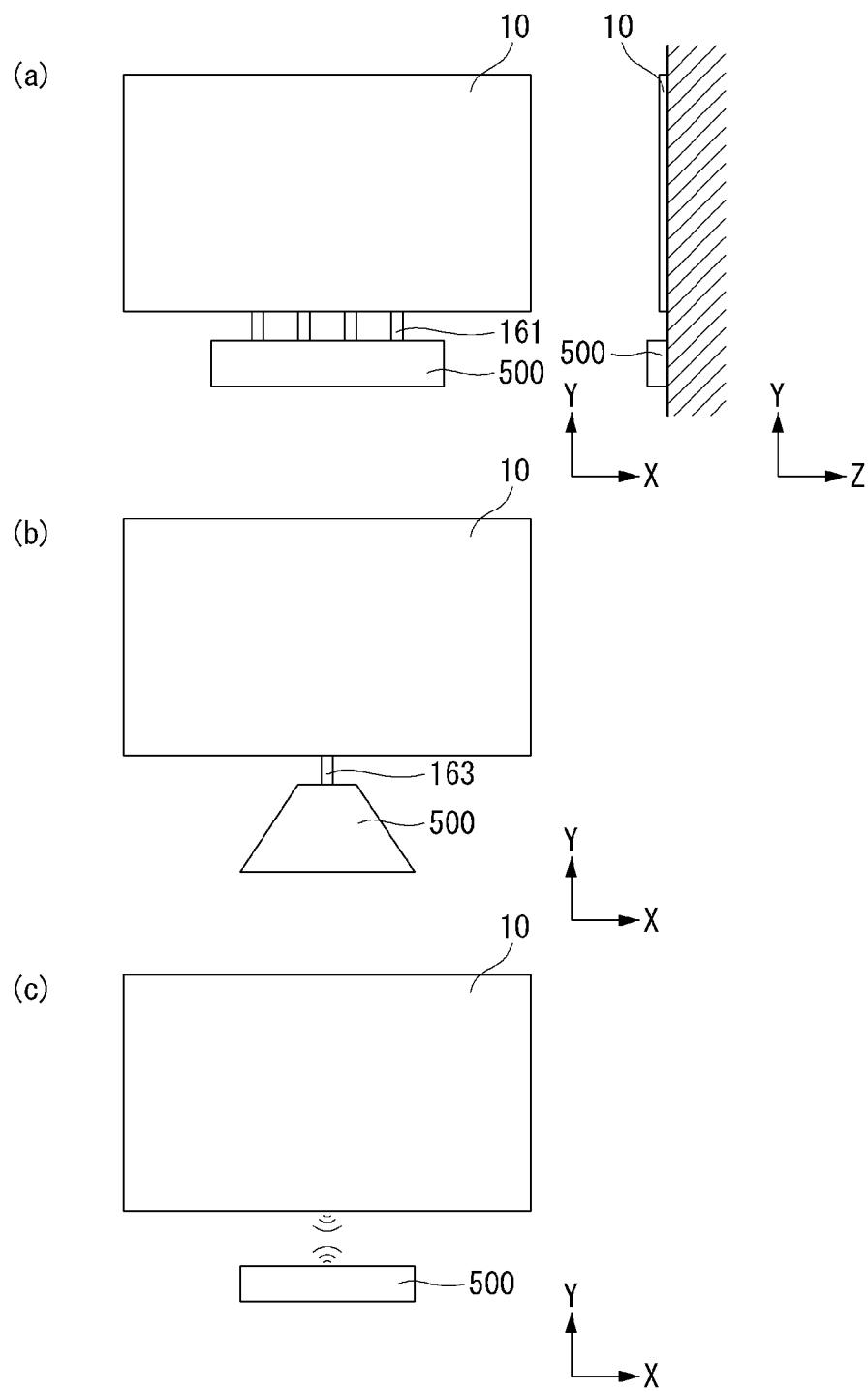

Referring to FIG. 5, the display device according to the present invention may include a housing 500 electrically connected to the body 10.

The housing 500 can transmit at least one signal to the body 10. The housing 500 can shield components that drive the display device. For example, the housing 500 can shield at least one printed circuit board (PCB). A combination structure and a combination method of the at least one PCB will be described in detail.

The housing 500 may be separated from the body 10 instead of coming into contact with the body 10. That is, the housing 500 may not be located in a region corresponding to a display screen. Accordingly, the housing 500 may not disturb the user when the user views the display screen.

For example, the housing 500 can be coupled to the body 10 through a plurality of flat cables 161, as shown in FIG. 5(a). The flat cables 161 can include a plurality of signal connection terminal pins and at least one ground terminal pin for coupling the housing 500 to the body 10. The flat cables 161 are cheaper than other cables.

Alternatively, the housing 500 may be coupled to the body 10 through a round cable 163, as shown in FIG. 5(b). That is, electrical signals transmitted through the plurality of flat cables 161 can be transmitted through one round cable 163. Since the housing 500 is coupled to the body through one round cable 163 instead of a plurality of cables, the appearance of the display device becomes neat.

Alternatively, the housing 500 and the body 10 may exchange electrical signals wirelessly, as shown in FIG. 5(c). In this case, the appearance of the display device can become neater than when the housing 500 is coupled to the body through the flat cables 161 or the round cable 163.

In the display device according to the present invention, the body 10 and the housing 500 may be separated from each other. Accordingly, the user can view the display screen without being disturbed by the housing and a display device having a thinner body 10 can be implemented.

Figure 6:
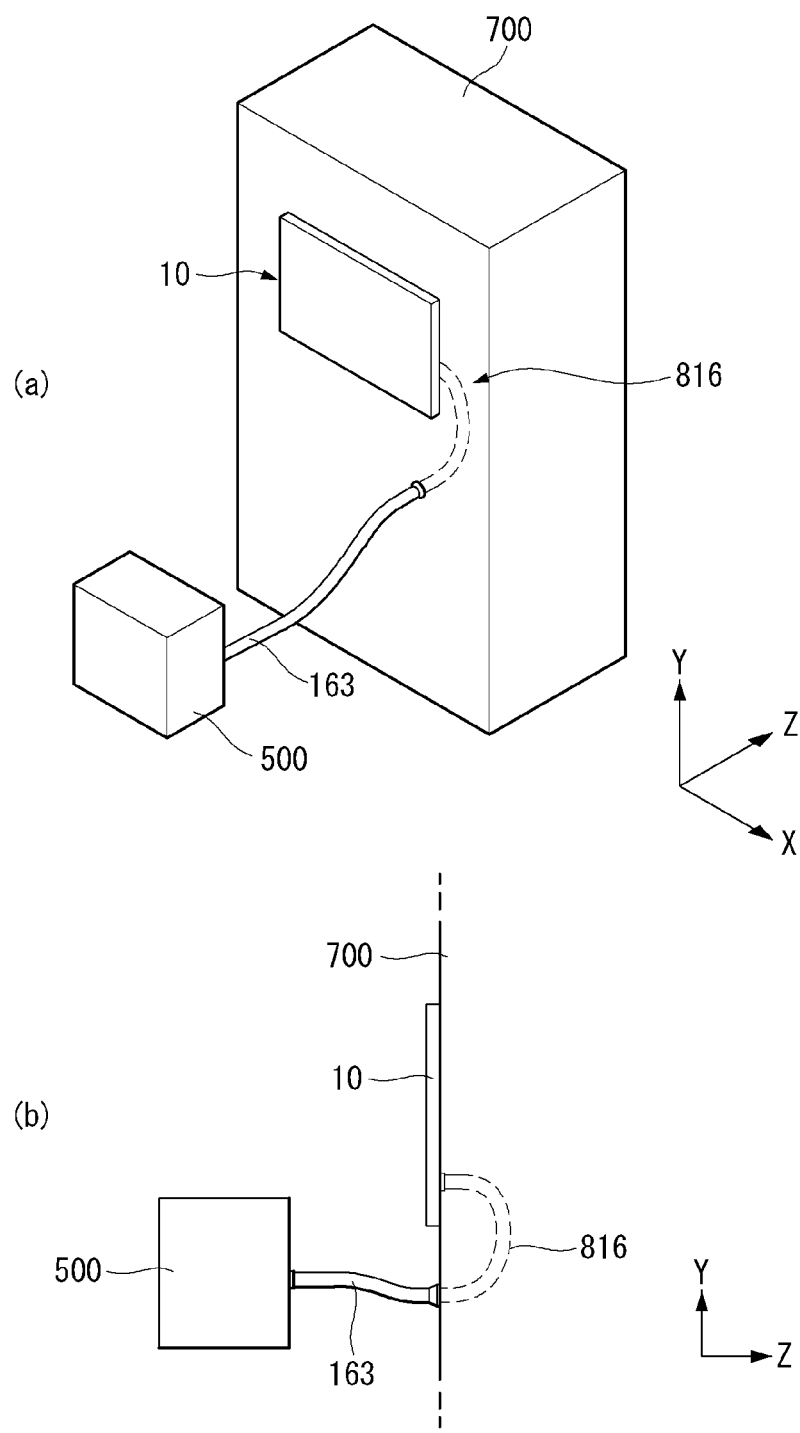

Referring to FIG. 6, the display device according to the present invention can exchange electrical signals with the housing 500 through an electrical wire 816 that penetrates an attached panel 700 to which the body 10 is attached. In this case, one side of a source PCB of the body 10 can be connected to the electrical wire 816.

The electrical wire 816 can penetrate the attached panel 700 to which the body 10 is attached to be inserted thereinto. One side of the electrical wire 816 can be connected to the source PCB and the other side thereof can be connected to the round cable 163. The electrical wire 816 may be provided inside of the panel 700 and thus the user cannot see the electrical wire 816.

In the display device according to the present invention, the body 10 and the housing 500 can be connected through the electrical wire 816 inserted into the inside of the panel 700 to which the body 10 is attached. Accordingly, the housing 500 and the body 10 may appear not to be directly connected. Therefore, the appearance of the display device looks neat and the user can concentrate on the display screen.

Figure 7:
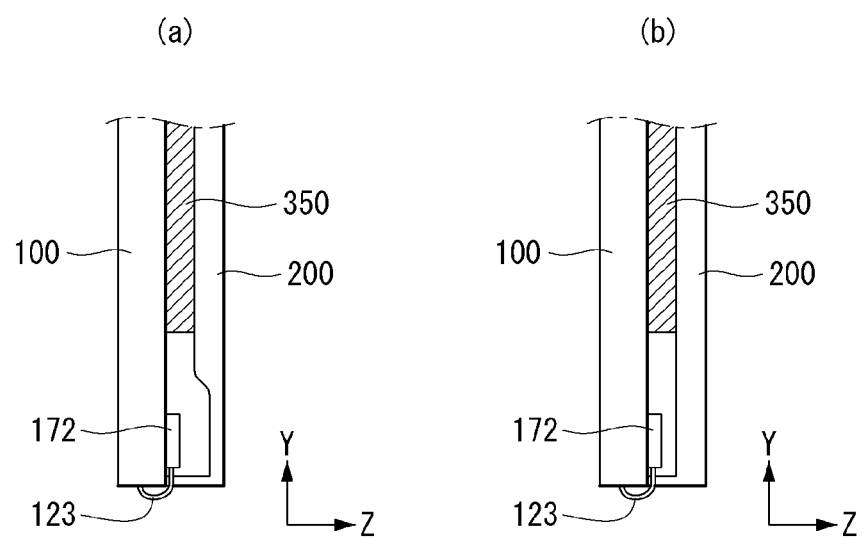

Referring to FIG. 7, in the display device according to the present invention, a PCB cover may not be provided to the body 10. Accordingly, the body 10 may require a space where a source PCB 172 can be located.

For example, a portion of the back cover 200, which corresponds to the source PCB 172, may be recessed, as shown in FIG. 7(a). In this case, the portion of the back cover 200, which corresponds to the source PCB 172, may be thinner than the other portion. Since the back cover 200 does not have a uniform thickness, the hardness of the back cover can be improved.

Since the portion of the back cover 200, which corresponds to the source PCB 172, is thinner, the source PCB 172 can be disposed on the rear side of the display panel 100 irrespective of the thickness of the adhesive sheet 350.

Alternatively, the back cover 200 may have a uniform thickness, as shown in FIG. 7(b). That is, the back cover 200 may not have a recessed portion. In this case, the thickness of the adhesive sheet 350 interposed between the display panel 100 and the back cover 200 in a third direction may be greater than the thickness of the source PCB 172 in the third direction.

Since the back cover 200 has a uniform thickness, a manufacturing process of the back cover 200 can be simplified and manufacturing costs can be reduced.

In the display device according to the present invention, the source PCB 172 may be located between the display panel 100 and the back cover 200. Accordingly, the back cover 200 may not require a through-hole or a hole formed therein. Therefore, the back cover 200 is not cracked and hardness thereof can be enhanced.

Figure 8:
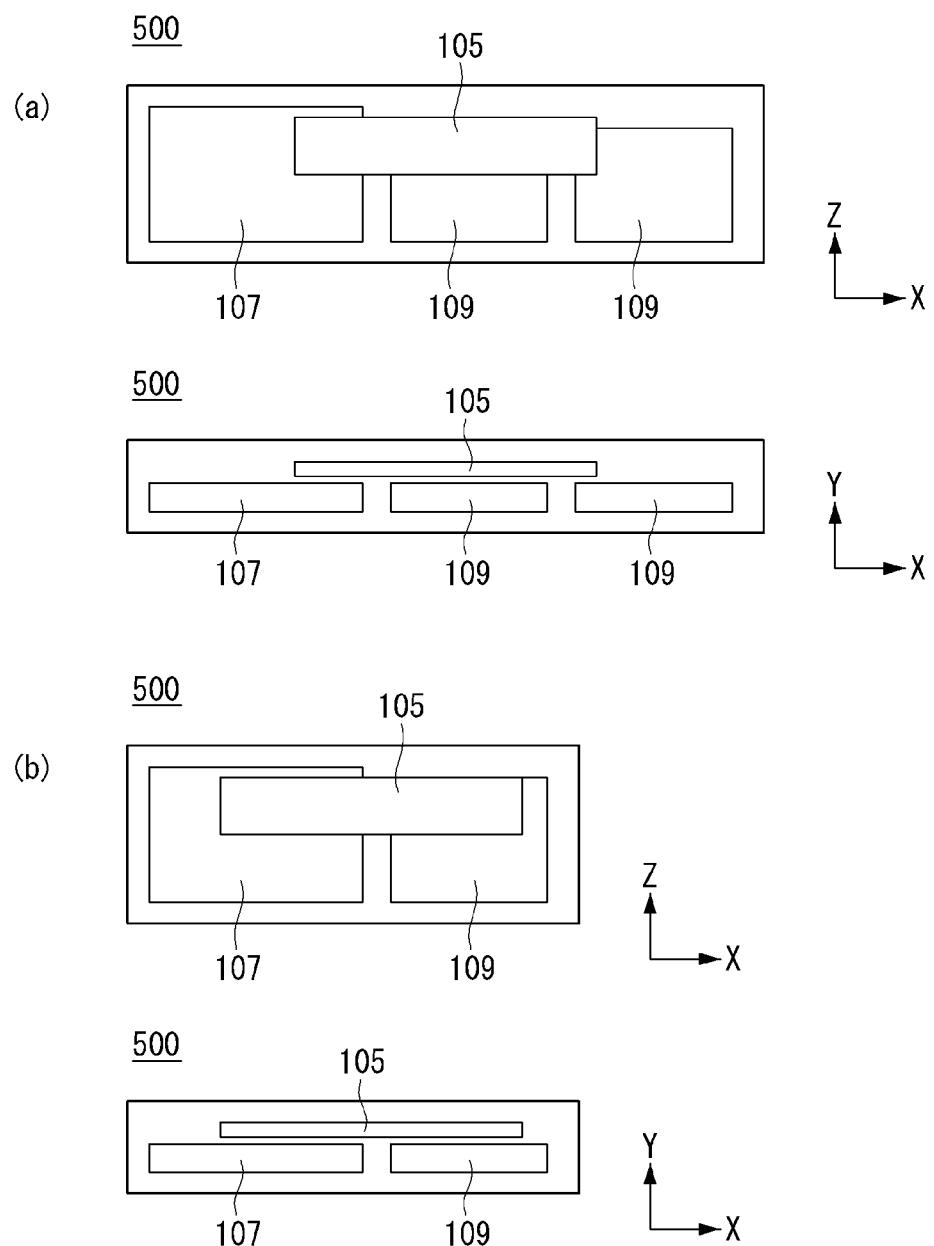

Referring to FIG. 8, one or more PCBs may be located inside of the housing 500. The PCBs may be located at intervals.

For example, the one or more PCBs may include main boards 109. The main boards 109 can provide an interface for operating the display device. In addition, the main boards 109 can optimize the state of the display device by checking and managing operating states of components of the display device.

Alternatively, the one or more PCBs may include a power supply 107. The power supply 107 can supply power to the display device. That is, the power supply 107 can supply power to the body. The power supply 107 can convert an AC frequency into a DC frequency. That is, the power supply can convert a low frequency into a high frequency so as to improve electrical efficiency.

Alternatively, the one or more PCBs may include a timing controller board 105. The timing controller board 105 may transfer a signal input thereto to the display panel 100. That is, the timing controller board 105 can transfer timing signals CLK, LOAD and SPi for controlling the source PCB and video signals R, G and B to the source PCB. In addition, the timing controller board 105 can control images. The timing controller board 105 can be coupled to the source PCB through one of a flat cable, a round cable and wireless communication.

As shown in FIG. 8(a), the main board 109 may be disposed at the center and right side of the housing 500 and separated from each other, and the power supply 107 may be disposed opposite the main board 109 located at the right side of the housing 500 in the direction of the long side of the housing 500 on the basis of the center of the housing 500.

The timing controller board 105 may be disposed on the main board 109 and the power supply 107. Since the timing controller board 105 is disposed on the main board 109 and the power supply 107, the inside space of the housing 500 can be saved.

A T-con shield (not shown) may be attached to a region where the timing controller board 105 is mounted in order to block electromagnetic waves emitted from the power supply 107 and the main board 109. That is, the timing controller board 105 can be disposed on the T-con shield instead of being disposed on the power supply 107 and the main board 109. Accordingly, the power supply 107 and the main board 109 and the timing controller board 105 may not interfere with each other. In addition, the T-con shield can protect the timing controller board 105 from impact applied thereto.

The timing controller board 105 may be superposed on the power supply 107 and the main board 109 in the height direction of the housing 500. Accordingly, the timing controller board 105 can be easily coupled to the power supply 107 and the main boards 109.

Referring to FIG. 8(b), one main board 109 may be mounted inside of the housing 500. Specifically, the main board 109 may be disposed at one side of the housing 500 and the power supply 107 may be disposed opposite the main board 109 in the direction of the long side of the housing 500.

The display device according to the present invention can save the internal space thereof since the timing controller board 105 is located on the power supply 107 and the main board 109. Accordingly, the size of the housing 500 can be reduced and thus the aesthetics of the display device can be improved.

Referring to FIG. 9, the display device according to the present invention may include speakers 117 provided to both sides of the front of the housing 500. The speakers 117 can output sound to the user. Accordingly, it is more efficient to dispose the speakers 117 to the front side of the housing 500.

As shown in FIG. 9(a), the speakers 117 may be mounted on the front side of the housing and separated from at least one PCB mounted inside of the housing 500. Alternatively, the speakers 117 may be disposed outside of the housing 500 and separated from the housing 500, as shown in FIG. 9(b). Since the speakers 117 are located outside of the housing 500, sound output from the speakers 117 can be well transferred to the user.

In the display device according to the present invention, the speakers 117 maybe disposed at the front side or both sides of the housing 500. Accordingly, sound of the display device, output through the speakers 117, can be well transferred to the user.

Figure 10:
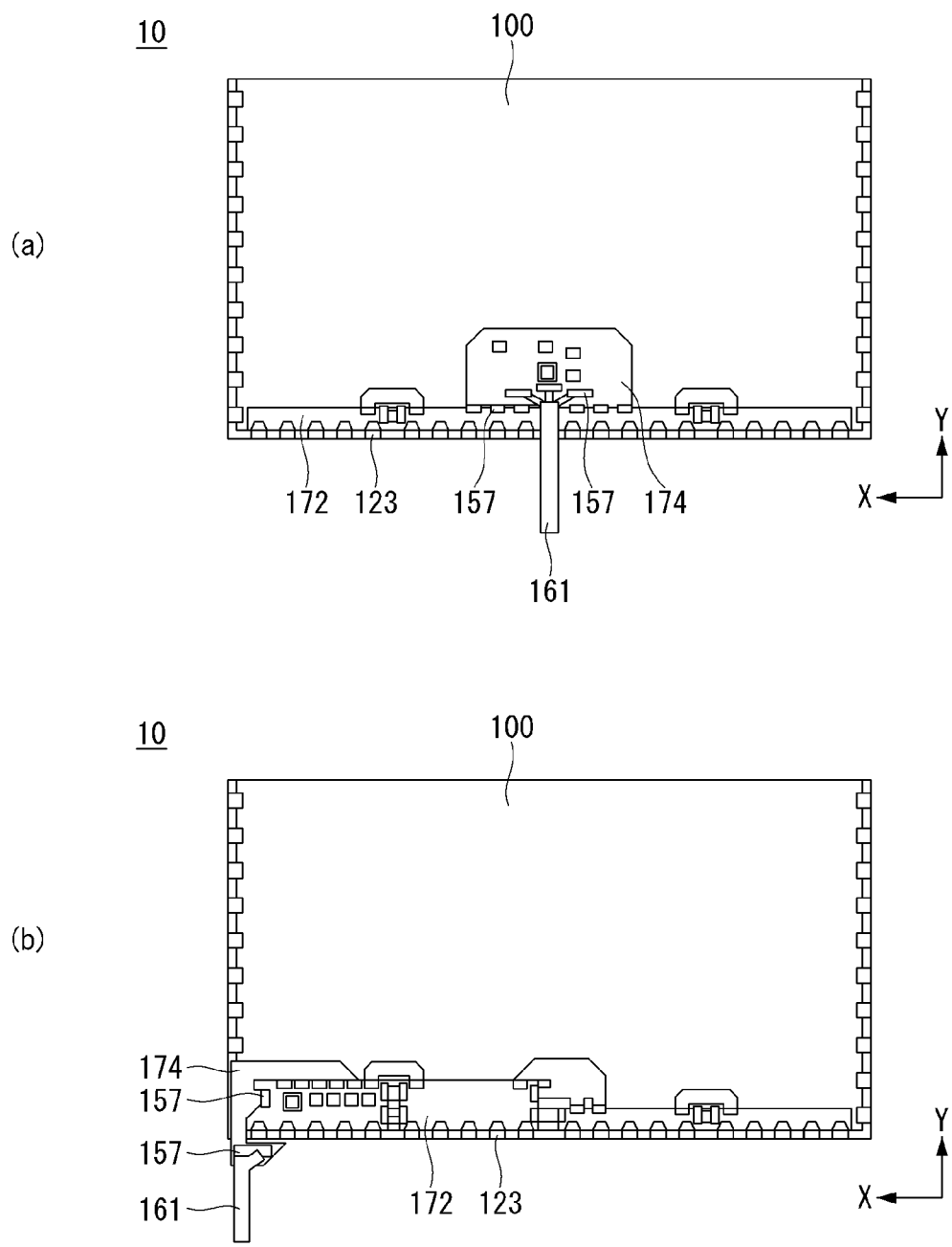

Referring to FIG. 10, a flexible printed circuit (FPC) board 174 may be disposed on the source PCB 172. The FPC board 174 may be located on the rear side of the display panel 100. The FPC board 174 can be coupled to the source PCB 172 through a connector 157. The connector 157, which is located above the source PCB 172, can connect the source PCB 172 and the lower end of the FPC board 174.

The source PCB 172 can deliver electrical signals to the housing through a flat cable 161. The flat cable 161 may include a plurality of signal connection terminal pins and at least one ground terminal pin for connecting the source PCB 172 and the housing. The flat cable 161 is cheaper than other cables.

As shown in FIG. 10(a), the FPC board 174 may be disposed at the center of the display panel 100. The FPC board 174 can be coupled to the flat cable 161 through the connector 157 located therein. Since the FPC board 174 is disposed at the center of the display panel 100, the flat cable 161 coupled to the FPC board 174 can also be located at the center of the display panel 100.

Various drive ICs may be mounted on the FPC board 174. The drive ICs can transmit and receive data between the source PCB and the housing. For example, the drive ICs can include a SERDES (serializer/deserializer) IC. The SERDES IC can convert serial data/parallel data into parallel data/serial data. Accordingly, the SERDES IC can rapidly transmit signals.

Referring to FIG. 10(b), the FPC board 174 may be disposed at one side of the display panel 100. Accordingly, the flat cable 161 coupled to the FPC board 174 can also be located at one side of the display panel 100. Since the flat cable 161 is located at one side of the display panel 100, the user can view the display screen without being disturbed by the flat cable 161.

In the present embodiment, one side of the FPC board 174 may be projected to the outside of the display panel 100. That is, one side of the FPC board 174 is exposed. Accordingly, the flat cable can be easily coupled to/separated from the FPC board 174 through the projected portion of the FPC board 174.

In the present embodiment, drive ICs may be mounted on the source PCB 172. Accordingly, the space of the display panel can be saved since drive ICs are not mounted on the FPC board 174.

The display device according to the present invention can be connected to the flat cable 161 through the FPC board 174. Accordingly, a larger quantity of data can be rapidly transmitted and received through the drive ICs mounted on the FPC board 174.

FIGS. 11 to 18 illustrate a connecting part of the display device body and the housing according to an embodiment of the present invention.

Figure 11:
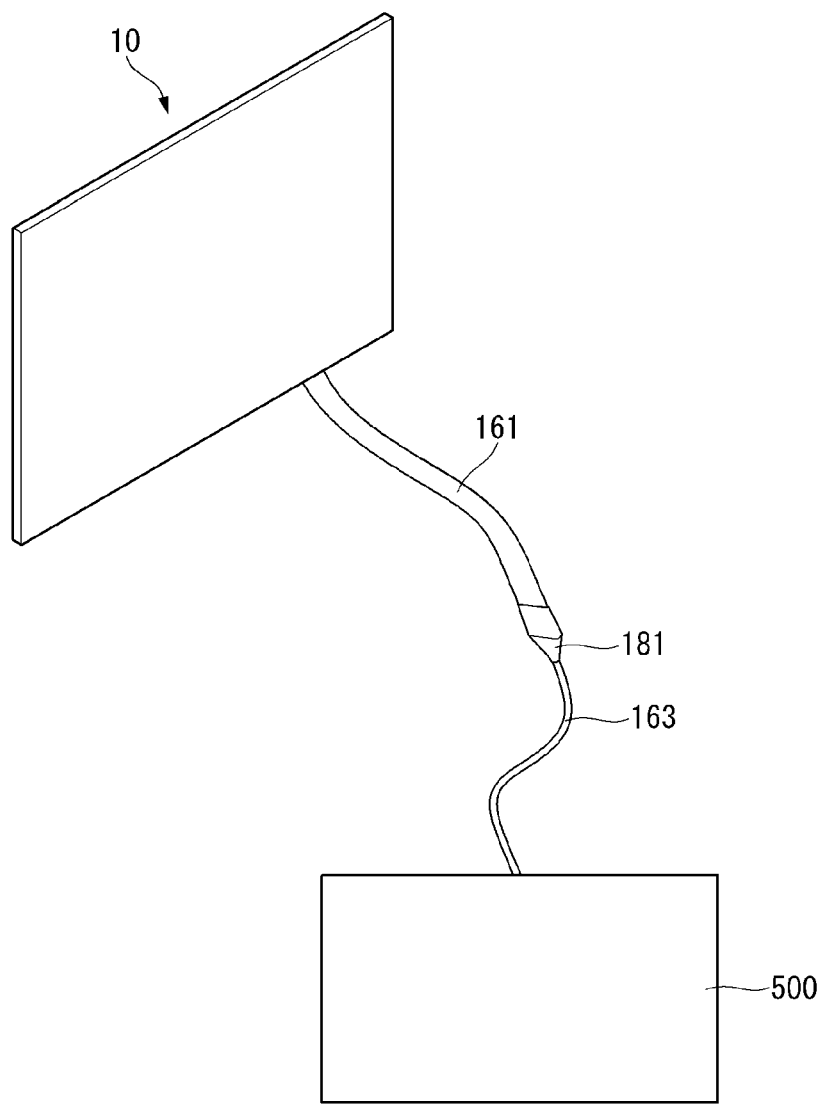

Referring to FIG. 11, the body 10 and the housing 500 may be coupled to each other through a flat cable 161 and a round cable 163. That is, data can be transmitted between the body 10 and the housing 500 through the flat cable 161 and the round cable 163.

The round cable 163 may be very thick and large. Accordingly, if the round cable 163 is directly connected to the body 10 attached to the panel for attaching the display device body 10 to a wall, the user may be disturbed by the round cable 163 when the user views the display screen. In addition, the display device may appear to not to be tightly coupled to the wall.

The flat cable 161 is very thin and thus may not disturb the user who is viewing the display screen when connected to the body 10. In addition, the display device can appear to be tightly coupled to the wall. However, the flat cable 161 may disturb the housing 500 when the housing 500 is moved since the flat cable 161 is thin and thus sags.

In addition, the flat cable 161 may be difficult to move horizontally although it can move forward and backward. Accordingly, if the body 10 and the housing 500 are connected through the flat cable 161 only, it may be difficult to freely move the housing 500.

The round cable 163 can be freely moved in every direction. Accordingly, the housing 500 can be freely moved when the body 10 and the housing 500 are connected through the round cable 163.

Therefore, the body 10 and the housing 500 can be connected through the flat cable 161 and the round cable 163 in such a manner that the flat cable 161 is coupled to the body 10 and the round cable 163 is coupled to the housing 500.

An FPC cable 181 may be coupled between the flat cable 161 and the round cable 163 so as to connect the flat cable 161 and the round cable 163. The FPC cable 181 can match the positions of a signal terminal and a power terminal of the flat cable 161 to the positions of a signal terminal and a power terminal of the round cable 163.

In the display device according to the present invention, signals can be transmitted using the flat cable 161 coupled to the body 10 and the round cable 163 coupled to the housing 500. Accordingly, the body 10 can appear to be tightly coupled to the panel to which the body 10 is attached. In addition, the housing 500 can be moved without being disturbed by the cables.

Figure 12:
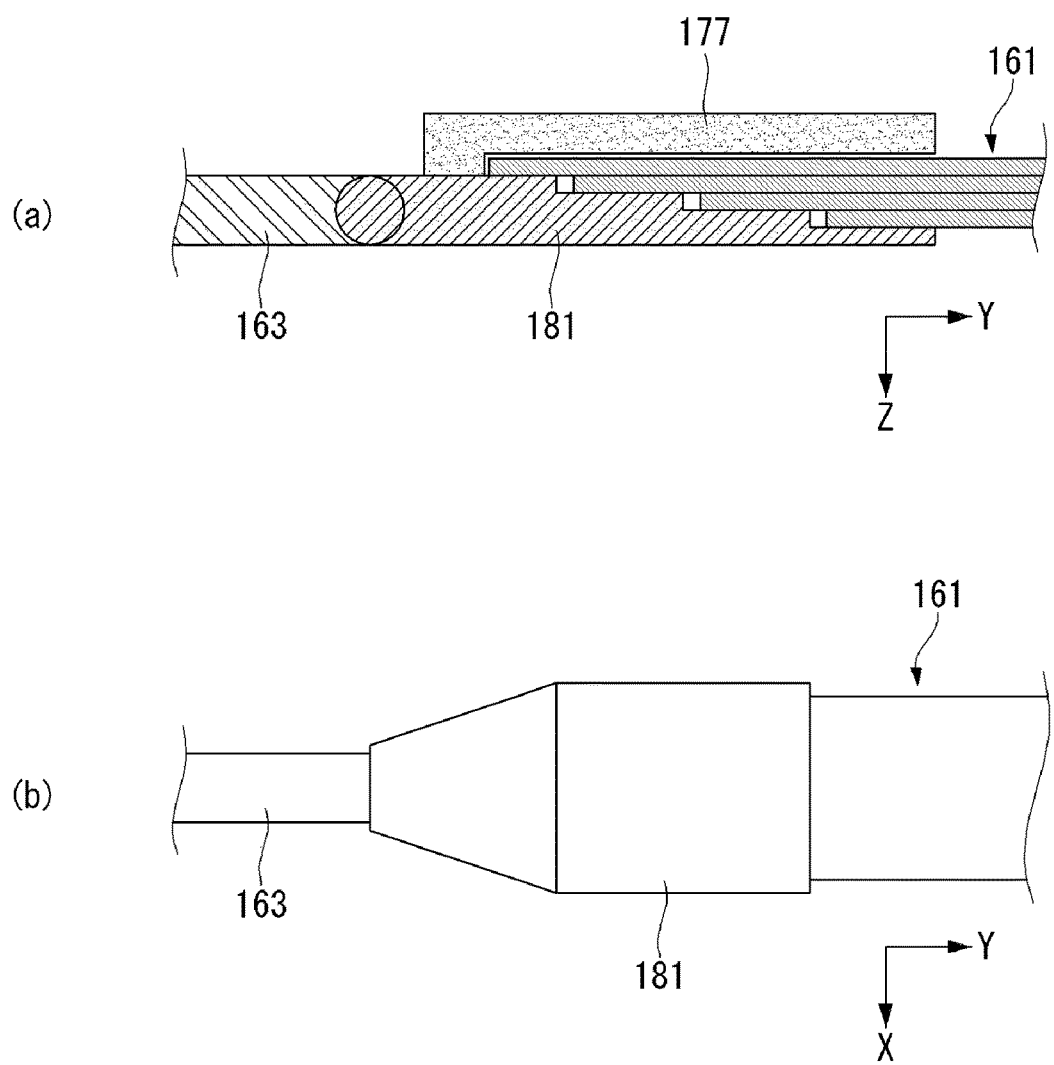

Referring to FIG. 12, an inserted part of the FPC cable 181 may have a stepped form. That is, the end of the inserted part of the FPC cable 181 is formed in stepped layers which have different protruding lengths. That is, the protruding length of a lower layer may be longer than that of an upper layer. For example, the protruding length of the lowest layer at the end of the FPC cable 181 is longest and protruding lengths of layers decrease with increasing distance from the highest layer. The FPC cable 181 can contact the flat cable 161 inserted corresponding to the respective layers. The FPC cable 181 can transfer signals transmitted to the respective layers to the round cable 163.

The width of the round cable 163 in a first direction may be narrower than the width of the flat cable 161 in the first direction. Accordingly, the width of the FPC cable 181 may decrease as the FPC cable 181 approaches the round cable 163. The flat cable 161 can be inserted into the inside of the FPC cable 181 and engage therewith. Accordingly, the end of the flat cable 161 may have a reversed stepped form. That is, the flat cable 161 is composed of multiple layers which have different protruding lengths.

A cable cover 177 may be disposed on the FPC cable 181 and separated therefrom. The cable cover 177 can cover the flat cable 161 when the flat cable 161 is inserted into the FPC cable. The cable cover 177 can guide an insertion position of the flat cable 161 such that the flat cable 161 can be correctly inserted into the FPC cable 181. That is, the flat cable 161 can engage between the cable cover 177 and the FPC cable 181.

Figure 13:
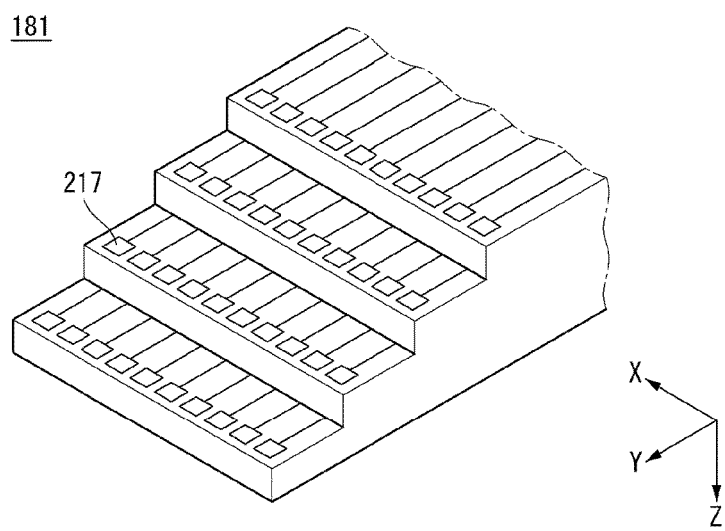

Referring to FIG. 13, the FPC cable 181 may include FPC terminals 217 provided to the upper surface of the end of each layer. The FPC terminals 217 may be formed of a metal material. The FPC terminals 217 can function as doorways through which transmitted/received data pass. The FPC terminals 217 can be arranged on the upper surface of the end of each layer at predetermined intervals. Accordingly, data transmitted through the respective FPC terminals 217 may not interfere with each other.

The layers of the FPC cable 181 may transfer different pieces of data. For example, one layer of the FPC cable 181 can transfer a signal and another layer thereof can transfer power. Since different pieces of data are transmitted through different layers of the FPC cable 181, interference between data can be prevented.

Figure 14:
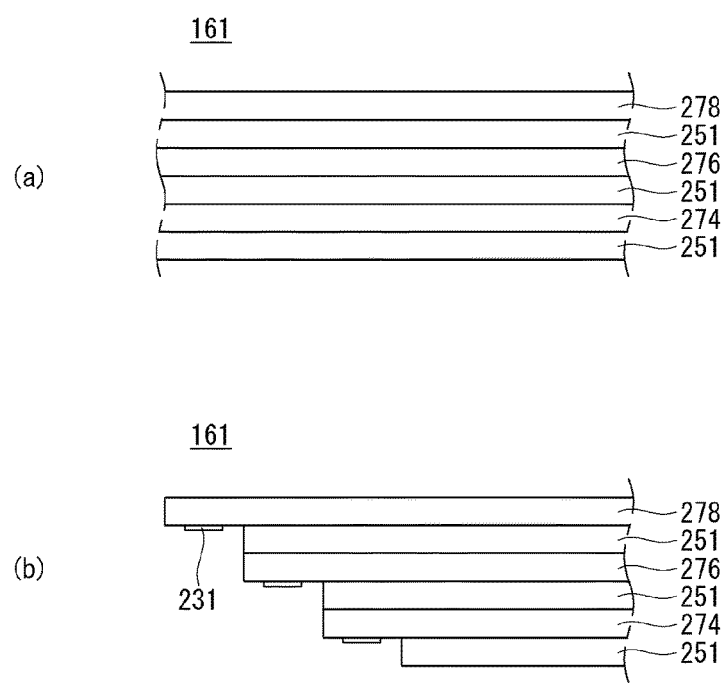

Referring to FIG. 14, the flat cable 161 may be composed of multiple layers. As shown in FIG. 14(a), the flat cable 161 may include a first power terminal 274, a second power terminal 276, a signal terminal 278 and a ground terminal 251 between data transfer layers.

Different power voltages can be respectively transferred through the first power terminal 274 and the second power terminal 276. For example, 12V can be transferred through the first power terminal 274 and 24V can be transferred through the second power terminal 276. The signal terminal 278 can transfer signals. The signal terminal 278 can transfer signals such that images corresponding to the signals can be displayed.

The ground terminal 251 may be interposed between the signal terminal 278 and the first and second power terminals 274 and 276. The ground terminal 251 can shield external noise and block interference between a signal and power.

While FIG. 14 shows the signal terminal 278 and the first and second power terminals 274 and 276, the present invention is not limited thereto and the signal terminal 278 and the first and second power terminals 274 and 276 may be further segmented. For example, a power terminal can be divided into parts for supplying 3.5V, 12V and 24V.

Referring to FIG. 14(b), the layers of the flat cable 161 at one end thereof may have different protruding lengths to engage with the FPC cable having a stepped form at the end thereof. The uppermost layer of the flat cable 161 may have the longest protruding length and the flat cable 161 may have a shorter protruding length with increasing distance to the uppermost layer. For example, the signal terminal 278 located at the top layer of the flat cable 161 can protrude more than the first and second power terminals 274 and 276 and the second power terminal 276 can protrude more than the first power terminal 274. That is, the signal terminal 278 and the first and second power terminals 274 and 276 may have a reversed stepped form.

Each of the signal terminal 278 and the first and second power terminals 274 and 276 may have a flat cable terminal 231 provided on the lower surface of one end thereof. The flat cable terminal 231 can transfer data from the signal terminal 278 or the first and second power terminals 274 and 276 to other parts. The flat cable terminal 231 may not contact other layers in such a manner that the flat cable terminal 231 is disposed at a part protruding from the layer under the layer on which the flat cable terminal 231 is located. The flat cable terminal 231 may include a metal material. The flat cable terminal 231 can transfer power or signals to the FPC terminals by contacting the FPC terminals.

Figure 15:
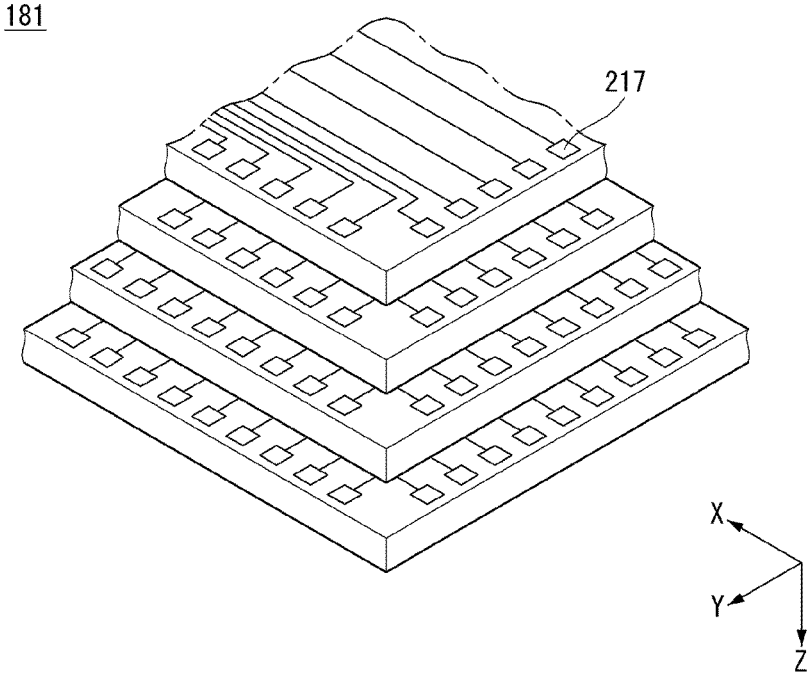

Referring to FIG. 15, not only one side of the inserted part of the FPC cable 181 but also a side connected to the side may have a stepped form. For example, the inserted part of the FPC cable 181 may include a first side facing the front and a second side connected to one end of the first side and perpendicular to the first side, and the first and second sides may have a stepped form.

The FPC terminals 217 may be disposed on upper surfaces of the ends of the layers at the first side and upper surfaces of the ends of the layers at the second side. The FPC terminals 217 may be located at predetermined intervals at the first and second sides.

Since the FPC terminals 217 are located at the second side as well as the first side, a larger number of FPC terminals 217 can be provided to each layer of the FPC cable 181. Accordingly, a larger amount of data can be transferred while maintaining the density of FPC terminals 217 without increasing the probability of short-circuiting between neighboring FPC terminals 217. In addition, the thickness of the FPC cable 181 can be reduced by decreasing the number of layers thereof.

Figure 16:
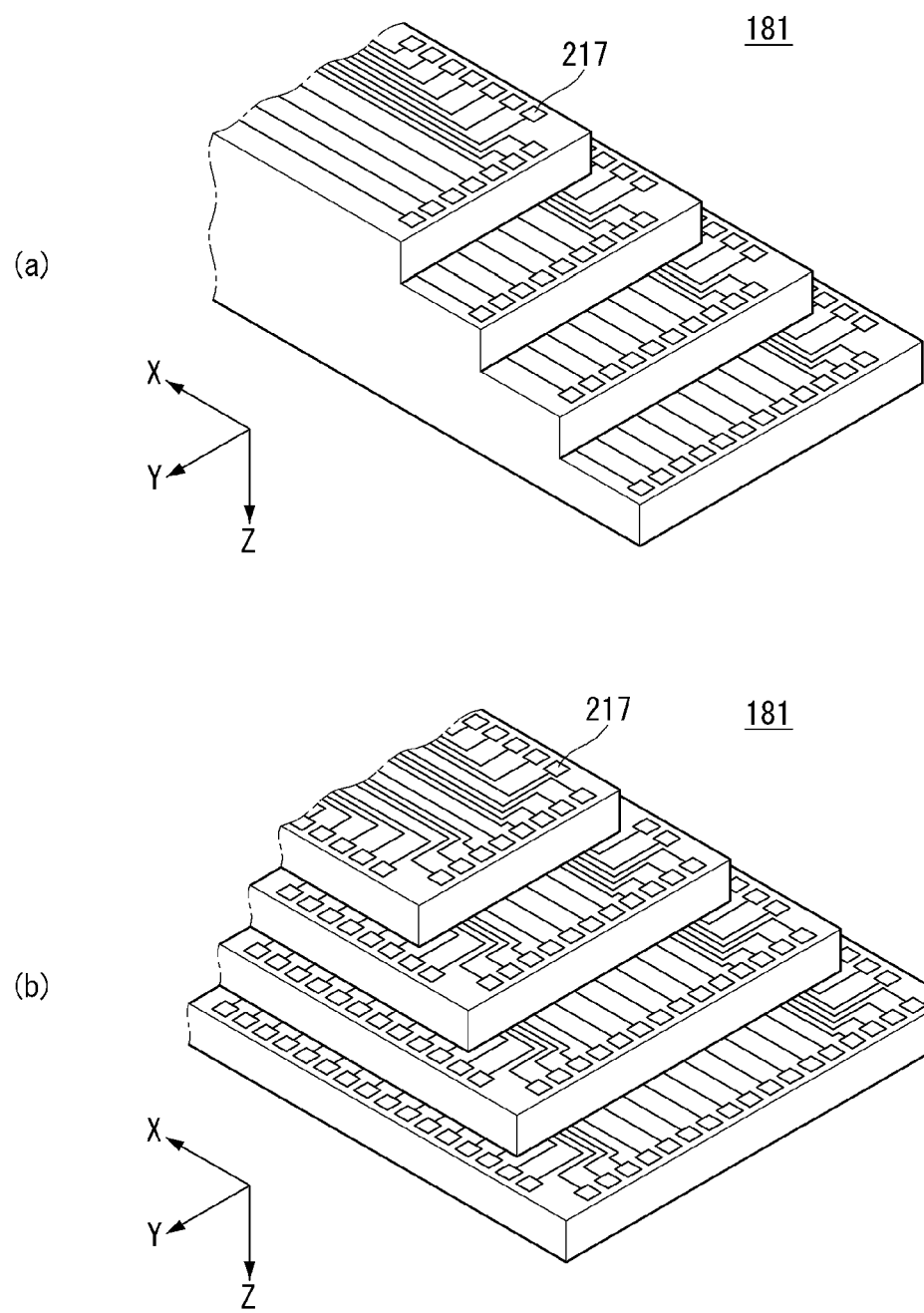

Referring to FIG. 16, not only one side of the inserted part of the FPC cable 181 but also one of sides connected to the side may have a stepped form, as shown in FIG. 16(a). For example, the inserted part of the FPC cable 181 may include the first side and a third side facing the second side and connected to one end of the first side, and the third side may have a stepped form.

The FPC terminals 217 may be disposed on the upper surfaces of the ends of the layers at the first side and upper surfaces of the ends of the layers at the third side. The FPC terminals 217 may be located at predetermined intervals at the first and second sides.

Referring to FIG. 16(b), not only one side of the inserted part of the FPC cable 181 but also both sides connected to the side may have a stepped form. That is, the inserted part of the FPC cable 181 may include the first side and second and third sides connected to both ends of the first side, and the second and third sides may have a stepped form.

The FPC terminals 217 may be disposed on the upper surfaces of the ends of the layers at the first, second and third sides. The FPC terminals 217 may be located at predetermined intervals at the first, second and second sides.

Since the FPC terminals 217 are located at the first, second and third sides, a larger number of FPC terminals 217 can be provided to each layer of the FPC cable 181. Accordingly, a larger amount of data can be transferred while maintaining the density of FPC terminals 217 without increasing the probability of short-circuiting between neighboring FPC terminals 217. In addition, the thickness of the FPC cable 181 can be reduced by decreasing the number of layers thereof.

Referring to FIG. 17, the FPC terminals 217 maybe disposed on the upper surfaces and front sides of the layers of the FPC cable 181, as shown in FIG. 17(a). The FPC terminals 217 located on the upper surfaces of the layers of the FPC cable 181 and the FPC terminals 217 located on the front sides of the layers of the FPC cable 181 may be alternatively disposed in a zigzag form. Accordingly, wires connected to the FPC terminals 217 can be extended in a straight line without overlapping.

The FPC terminals 217 can be disposed not only on the upper surfaces of the layers of the FPC cable 181 but also on the front sides thereof. Accordingly, a larger amount of data can be transferred while maintaining the density of FPC terminals 217 without increasing the probability of short-circuiting between neighboring FPC terminals 217. In addition, the thickness of the FPC cable 181 can be reduced by decreasing the number of layers thereof.

Referring to FIG. 17(b), the FPC cables 181 maybe disposed on the front sides of the layers of the FPC cable 181. Since the FPC terminals 217 are disposed only on the front sides of the layers of the FPC cable 181, the FPC terminals 217 can be inserted into the flat cable without collision and come into contact with the flat cable after complete insertion. Accordingly, the FPC terminals 217 are not damaged even when connection and separation between the FPC cable and the flat cable are repeated.

Referring to FIG. 18, in a conventional display device, the signal terminal 278 and the first and second power terminals 274 and 276 are located inside of the flat cable 161, as shown in FIG. 18(a). The signal terminal 278 is located at the center of the flat cable 161 and the first and second power terminals 274 and 276 are located at both sides of the signal terminal 278.

Different levels of power are supplied through the first power terminal 274 and the second power terminal 276. The signal terminal 278 can transfer signals. The signal terminal 278 can transfer a signal such that an image corresponding to the signal can be displayed.

In the conventional flat cable 161, the first and second power terminals 274 and 276 and the signal terminal 278 are located on one layer. That is, the first and second power terminals 274 and 276 and the signal terminal 278 can be located on the same plane.

Referring to FIG. 18(b), the display device according to the present invention can be configured in such a manner that the signal terminal 278 and the first and second power terminals 274 and 276 are arranged in multiple layers inside of the flat cable 161. Accordingly, the width FFW2 of the flat cable 161 according to the present invention can be less than the width FFW1 of the conventional flat cable 161. For example, the signal terminal 278 can be disposed at the top level and the second power terminal 276 and the first power terminal can be sequentially located under the signal terminal 278.

Therefore, interference between the signal terminal 278 and the first and second power terminals 274 and 276 of the flat cable 161 can be reduced. In addition, since the width FFW2 of the flat cable 161 is narrow, wiring between signal terminals and power terminals of the flat cable 161 and a round cable can be easily switched.

FIGS. 19, 20 and 21 illustrate the display device according to an embodiment of the present invention.

Referring to FIG. 19, in the display device according to the present invention, the length of the flat cable 161, which is exposed to the outside, can be freely adjusted. That is, the display device can be in one of a first state in which the exposed length of the flat cable 161 is relatively long and a second state in which the exposed length of the flat cable 161 is relatively short.

For example, the body 10 and the housing 500 can be separated from each other, as shown in FIG. 19(a). In this case, the exposed length FD1 of the flat cable 161 is relatively long. That is, the display device is in the first state. Since the body 10 and the housing 300 are separated from each other, the user can concentrate on displayed images.

Referring to FIG. 19(b), the body 10 and the housing 500 can be closely arranged. That is, the display device is in the second state. In this case, the exposed length FD2 of the flat cable 161 is short. Since the exposed length FD2 of the flat cable 161 is short, the display device has a neat appearance. In addition, there is a low possibility that the flat cable 161 is twisted.

The exposed length of the flat cable 161 of the display device according to the present invention can be freely controlled. Accordingly, the body 10 and the housing 500 can be arranged as the user desires.

Referring to FIG. 20, the display device according to the present invention may be configured in such a manner that a support bar 326 on which the flat cable 161 hangs is disposed inside of the body 10. The support body 326 can move inside of the body 10. For example, the support bar 326 can move up and down as the display device switches from the first state to the second state.

As shown in FIG. 20(a), the support bar 326 can be located closely above the FPC board 174 in the first state. Accordingly, the flat cable 161 in proximity to the FPC board 174 can hang on the support bar 326. That is, the distance between the connector 157, which connects the FPC board 174 and the flat cable 161, and the support bar 326 can be relatively short. In this case, since a relatively short portion of the flat cable 161 hangs on the support bar 326, the exposed length of the flat cable 161 can be relatively long.

Referring to FIG. 20(b), the support bar 326 can be located a long distance from the FPC board 174 in the second state. That is, the support bar 326 can be located higher in the second state than in the first state. Accordingly, the distance between the connector 157, which connects the FPC board 174 and the flat cable 161, and the support bar 326 can be relatively long. In this case, since a relatively long portion of the flat cable 161 hangs on the support bar 326, the exposed length of the flat cable 161 can be relatively short.

According to the present invention, the exposed length of the flat cable 161 can be adjusted by controlling the support bar 326 disposed inside of the display device. Accordingly, the appearance of the display device becomes neat since the extra portion of the flat cable 161 is located inside of the display device. In addition, the flat cable 161 is prevented from being twisted since the length of the flat cable 161 is adjusted by moving the support bar 326 up and down.

Referring to FIG. 21(a), the display device according to the present invention may include a blind case 380 provided to the upper part of the body 10. The blind case 380 may be a part where a driving unit for driving the support bar 326 is located. The blind case 380 can shield the driving unit of the support bar 326.

A driving loop 371 may be disposed at one side of the blind case 380. The driving loop 371 may hang on at least part of the driving unit located inside of the blind case 380. The user can operate the driving loop 372 to move the support bar 326 up and down.

Referring to FIG. 21(b), a first rotating plate 240 and a second rotating plate 260 may be located inside of the blind case 380. A line 342 hanging on the support bar 326 may be wound around the first rotating plate 240 and the second rotating plate 260.

The driving loop 371 may be wound around the second rotating plate 260. The driving loop 371 may include a first driving loop 371a and a second driving loop 371b which are opposite each other on the basis of the second rotating plate 260. The second rotating plate 260 can rotate in a first direction corresponding to clockwise when the first driving loop 371a is pulled and rotate in a second direction corresponding to counterclockwise when the second driving loop 371b is pulled.

When the support bar 326 is located at a lower part of the display device, the second rotating plate 260 can rotate in the second direction when the second driving loop 371b is pulled. As the second rotating plate 260 rotates in the second direction, a longer portion of the line 342 can be wound around the second rotating plate 260. That is, one end of the line 342 can be moved upward. In this case, the support bar 326 can be moved along with the line 342 so as to reduce the exposed length of the flat cable.

When the first driving loop 371a is pulled with the support 326 moved upward, the second rotating plate 260 can rotate in the first direction. As the second rotating plate 260 rotates in the first direction, the line 342 is gradually released from the second rotating plate 260. That is, one end of the line 342 is moved down. In this case, the support bar 326 can be moved down along with the line 342 so as to increase the exposed length of the flat cable.

That is, according to the present invention, the support bar 326 can be moved without being directly touched. Accordingly, the user can conveniently move the support bar 326 up and down.

FIGS. 22 to 29 illustrate a display device according to another embodiment of the present invention.

Figure 22:
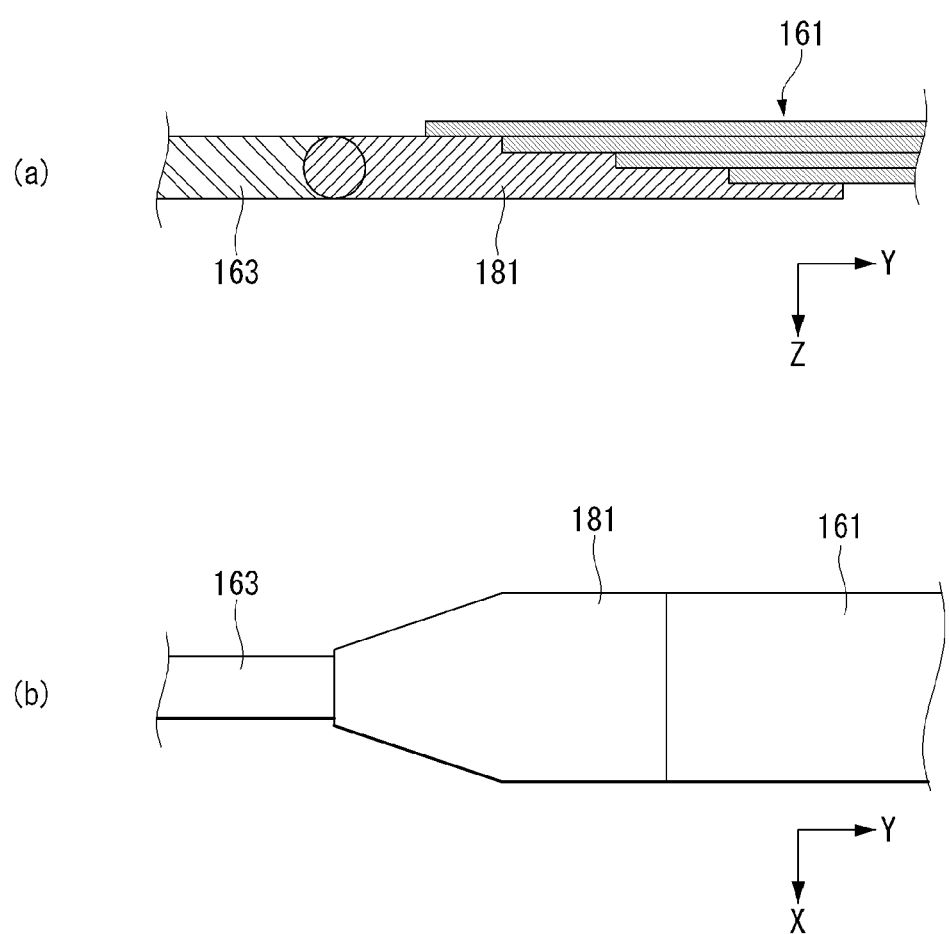

Referring to FIG. 22, the display device according to the present invention may not include the cable cover for covering the flat cable 161. Accordingly, the upper surface of the flat cable 161 can be exposed to the outside. In addition, since the cable cover is not provided to the display device, the flat cable 161 can be easily coupled to/detached from the FPC cable 181.

From a top view, the flat cable 161 is disposed at the part where the width of the FPC cable 181 widens, and thus the display device looks neater.

Figure 23:
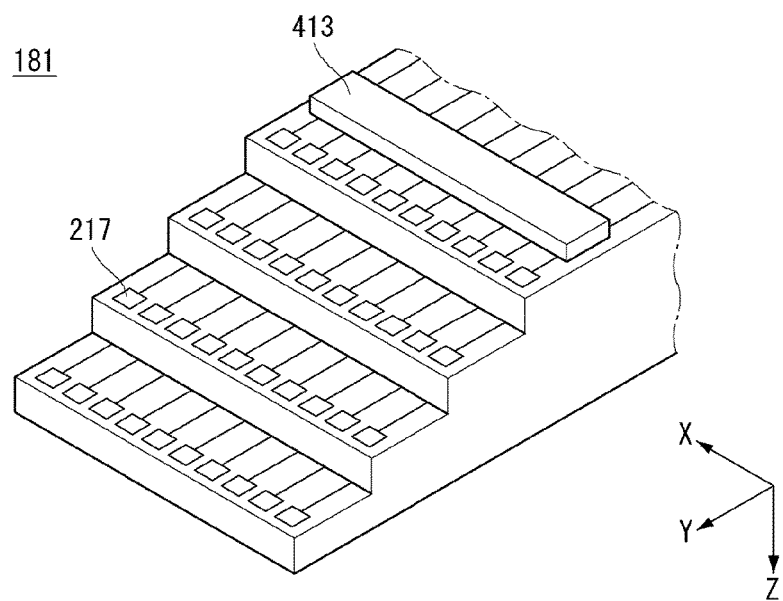

Referring to FIG. 23, the FPC cable 181 may include a first coupling part 413 disposed on the upper surface of the end of the uppermost layer thereof. The first coupling part 413 may be disposed more inwardly than the FPC terminals 217. The first coupling part 413 may include a magnetic material. The first coupling part 413 may protrude upward. The first coupling part 413 may be extended in the first direction. However, the present invention is not limited thereto and a plurality of first coupling parts 413 may be arranged at intervals.

Since the first coupling part 413 is located on the upper surface of the FPC cable 181, the FPC cable 181 and the flat cable can be coupled without a cable cover.

Figure 24:
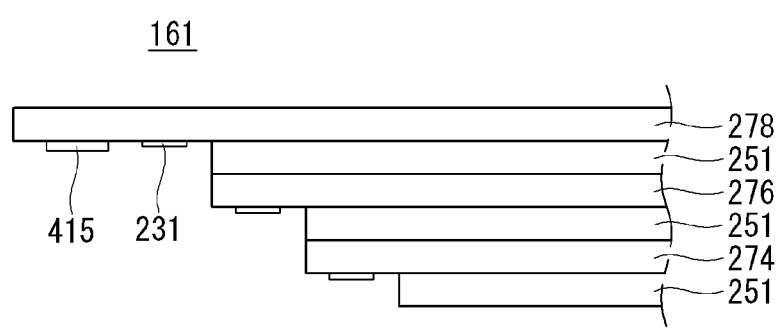

Referring to FIG. 24, the flat cable 161 may include a second coupling part 415 provided in front of the flat cable terminal 231. The second coupling part 415 may protrude downward from the flat cable 161. The second coupling part may include a magnetic material having polarity opposite the first coupling part. The second coupling part 415 may be extended in the first direction. However, the present invention is not limited thereto and a plurality of second coupling parts 415 may be arranged at intervals Since the second coupling part 415 is provided to the flat cable 161, the flat cable 161 and the FPC cable can be coupled without a cable cover.

Figure 25:
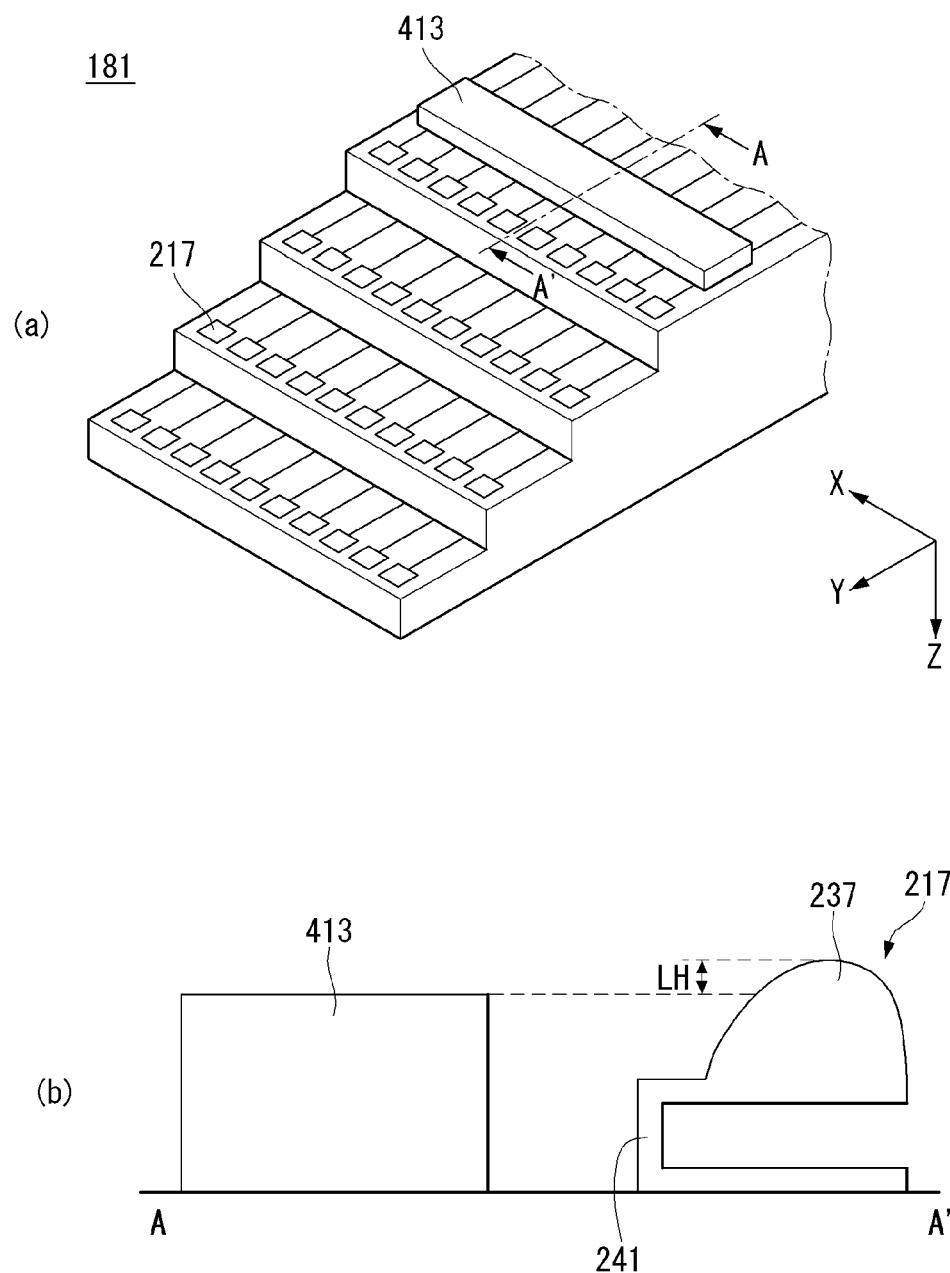

Referring to FIG. 25, the FPC terminals 217 of the display device according to the present invention may protrude upward like the first coupling part 413. The protruding portions of the FPC terminals 217 may be extended from metal lines mounted inside of the FPC cable 181. However, the present invention is not limited thereto and the protruding portions of the FPC terminals 217 may be attached to the metal lines mounted inside of the FPC cable 181.

Each protruding portion may include a support portion 241 and a contact portion 237. The support part 241 may be a part that connects the contact part 237 of the FPC terminal 217 and the metal line mounted inside of the FPC cable 181. The support portion 241 may be disposed only at one side of the contact portion 237. That is, the part of the contact portion 237 except for the part corresponding to the support portion 241 can be separated from the metal line disposed inside of the FPC cable 181.

The contact portion 237 may have a smaller diameter as the contact portion 237 goes to the top thereof. That is, the contact portion 237 can have a semispherical shape. The contact portion 237 may be a part contacting a terminal of the flat cable. Accordingly, the contact portion 237 can include a high conductivity material.

The top of the contact portion 237 may be higher than the top of the first coupling part 413 by a predetermined height LH. If the top of the contact portion 237 is lower than the top of the first coupling part 413, the contact portion 237 may not contact a flat cable terminal due to the first coupling part 413 when the FPC cable 181 is coupled to the flat cable.

Figure 26:
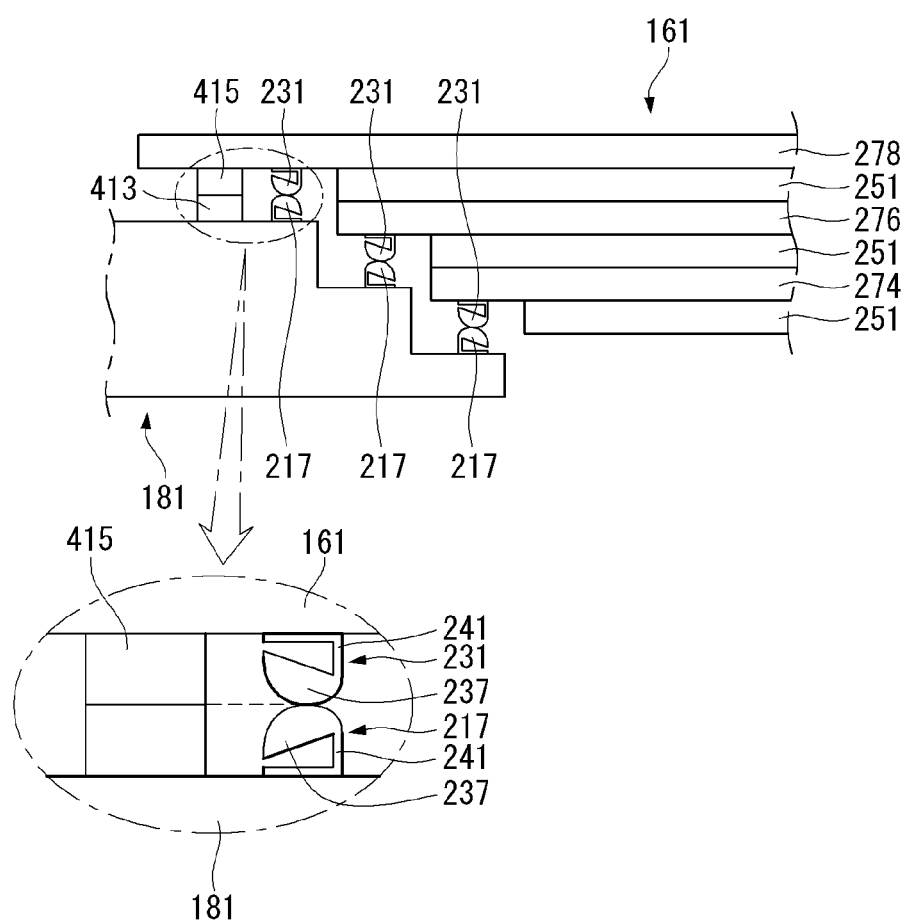

Referring to FIG. 26, according to the display device of the present invention, the flat cable 161 and the FPC cable 181 can be coupled through the first and second coupling parts 413 and 415. The first and second coupling parts 413 and 415 can be strongly coupled to each other when the first coupling part 413 approximates the second coupling part 415 since the first and second coupling parts 413 and 415 have opposite polarities.

Each flat cable terminal 231 can include the support portion 241 and the contact portion 237 like the FPC terminal 217. The support portion 241 and the contact portion 237 of the flat cable terminal 231 may be the same as the support portion 241 and the contact portion 237 of the FPC terminal 217 except for protruding direction. That is, the support portion 241 and the contact portion 237 of the flat cable terminal 231 may have an upside-down form of the support portion 241 and the contact portion 237 of the FPC terminal 217.

When the first and second coupling parts 413 and 415 are coupled, the contact portion 237 of the flat cable terminal 231 and the contact portion 237 of the FPC terminal 217 can contact each other. When the first and second coupling parts 413 and 415 are coupled, the height of the top of the contact portion 237 may be the same as the height of the upper surface of the first coupling part 413. That is, the distance between the contact portion 237 and the metal line mounted inside of the FPC cable 181, which does not correspond to the support portion 241, can be reduced. Since the part of the contact portion 237, which does not correspond to the support part 241, can be freely moved, the first and second coupling parts 413 and 415 can contact each other.

However, the present invention is not limited thereto and the first and second coupling parts 413 and 415 maybe coupled according to magnetic force while being separated from each other with the shape of the contact portions 237 thereof maintained.

According to the present invention, the heights of the tops of the FPC terminal 217 and the flat cable terminal 231 can be freely changed. Accordingly, contact of the FPC terminal 217 and the flat cable terminal 231 can be maintained. In addition, the flat cable 161 and the FPC cable 181 can be strongly coupled to each other.

Figure 27:
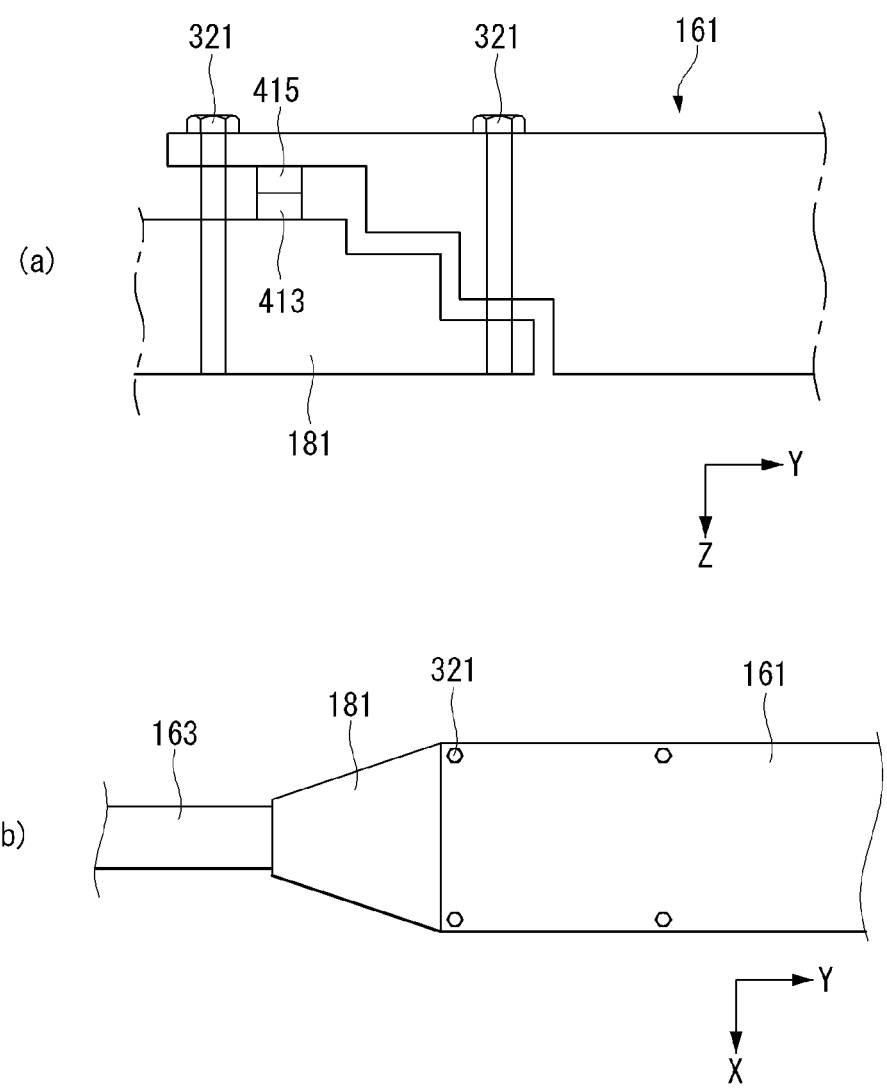

Referring to FIG. 27, in the display device according to the present invention, the FPC cable 181 and the flat cable 161 may be coupled through one or more screws 321 as well as the first and second coupling parts 413 and 415. The one or more screws 321 may be disposed at four corners of the region where the FPC cable 181 and the flat cable 161 overlap. However, the present invention is not limited thereto and the screws 321 may be provided to any region where the FPC cable 181 and the flat cable 161 overlap.

The FPC cable and the flat cable 161 can be strongly coupled since the screws 321 as well as the first and second coupling parts 413 and 415 are used.

Figure 28:
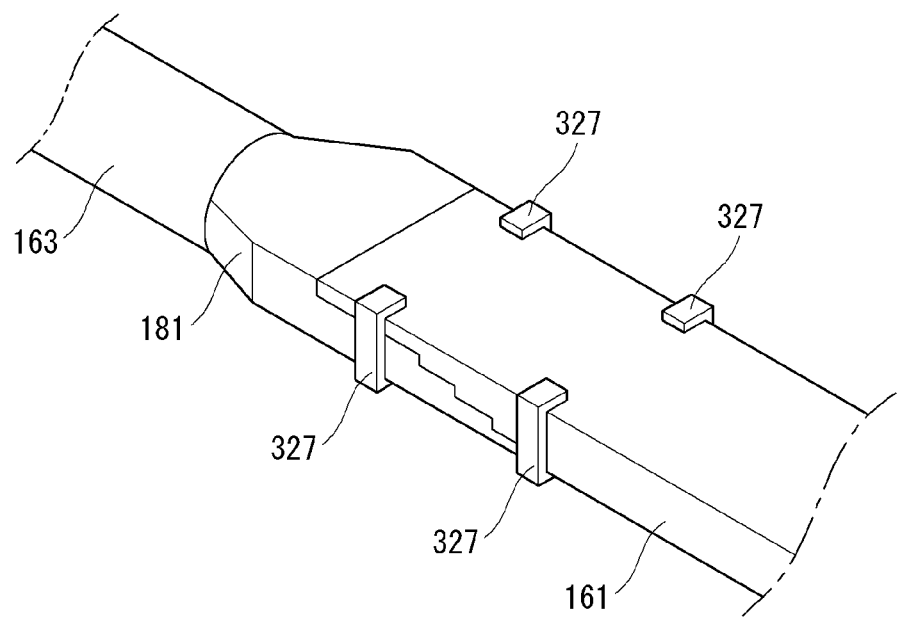

Referring to FIG. 28, in the display device according to the present invention, the FPC cable 181 and the flat cable 161 may be coupled through one or more fixing holders 327 as well as the first and second coupling parts 413 and 415. The one or more fixing holders 327 may be fastened to portions of sides adjacent to corners of the region where the FPC cable 181 and the flat cable 161 overlap. However, the present invention is not limited thereto and the fixing holders 327 may be provided to portions of sides of any region where the FPC cable 181 and the flat cable 161 overlap.

The fixing holders 327 can fasten the part at which the FPC cable 181 and the flat cable 161 overlap. The fixing holders 327 can maintain the state in which the lower surface of the FPC cable 181 and the upper surface of the flat cable 161 come into contact with each other. One end of each fixing holder 327 may come into contact with the lower surface of the FPC cable 181 and the other end thereof may come into contact with the upper surface of the flat cable 181.

The FPC cable 161 and the flat cable 161 can be strongly coupled according to the fixing holders 327, and thus non-contact between terminals of the flat cable 161 and the FPC cable 181 can be prevented.

Referring to FIG. 29, a plug 442 may be disposed at one end of the flat cable 161. The plug 442 can be inserted into the body 10. The width of the plug 442 in the first direction can increase with increasing distance to the end of the plug 442. That is, signal terminals and power terminals disposed inside of the plug 442 can be spread wide. Accordingly, the plug 442 is thin and thus can be inserted into the body 10.

The plug 442 inserted into the body 10 can be inserted into a slot 467. The slot 467 may be mounted on the FPC board 174. The slot 467 can guide a position into which the plug 442 is inserted. The slot 467 can transfer data delivered from the plug 442 to the FPC board 174.

The plug 442 can be easily separated from/coupled to the slot 467 as necessary. Accordingly, the user can easily combine/separate the housing with/from the body 10. In addition, when the housing is combined with the body 10, the plug 10 is located inside of the body 10 and thus the appearance of the display device becomes clean.

The slot 467 may be located at the center of the body 10, as shown in FIG. 29(a). Alternatively, the slot 467 may be disposed at one side of the body 10, as shown in FIG. 29(b). In this case, the plug 442 and the flat cable 161 coupled to the slot 467 can also be located at one side of the body 10 and thus do not disturb the user when the user views displayed images.

Figure 30:
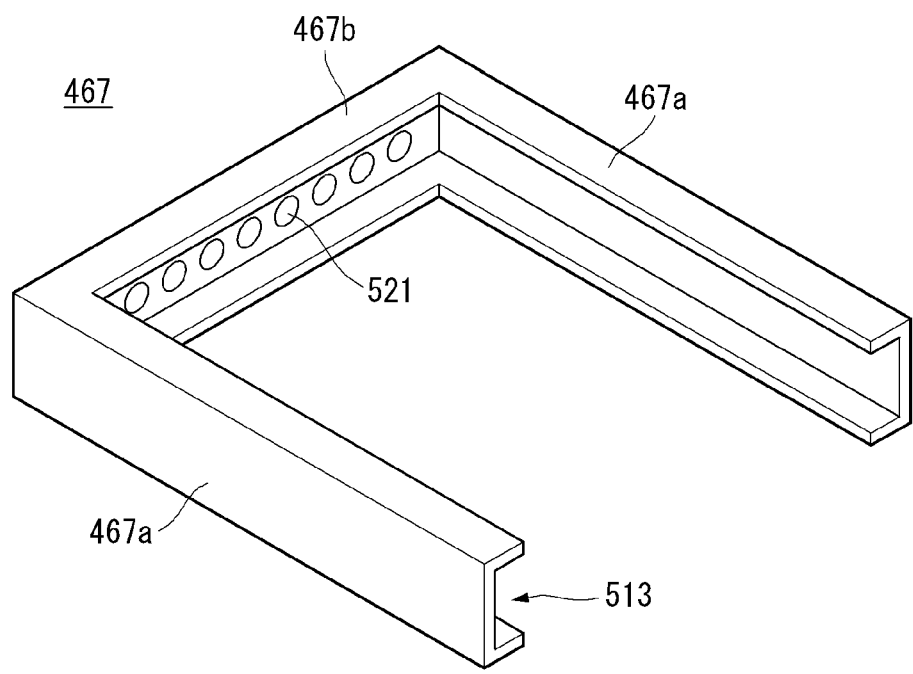

Referring to FIG. 30, the slot 467 may include side slots 457a and a body slot 467b. The side slots 467a may be extended from both ends of the body slot 467b in a direction perpendicular to the body slot 467b.

The side slots 467a may include guide grooves 513 formed therein. The guide grooves 513 may be recesses formed at the inside centers of the side slots 467a. The guide grooves 513 may be parts that guide insertion of the plug.

The body slot 467b may include a plurality of connector sockets 521 arranged therein. The plurality of connector sockets 521 may be arranged at intervals. The connector sockets 521 may be parts into which connector pins of the plug are inserted. The body slot 467b can function as a connector. That is, the body slot 467b can transfer data delivered through the connector sockets 521 to the FPC board.

The slot 467 can guide correct insertion of the plug through the guide grooves 153 provided to the side slots 467a. Accordingly, the user can easily connect or separate the plug. In addition, the slot 467 can transfer data simultaneously with insertion of the plug since the connector sockets 521 are provided inside of the body slot 467b. Accordingly, the user can transmit data of the housing to the body more conveniently.

Figure 31:
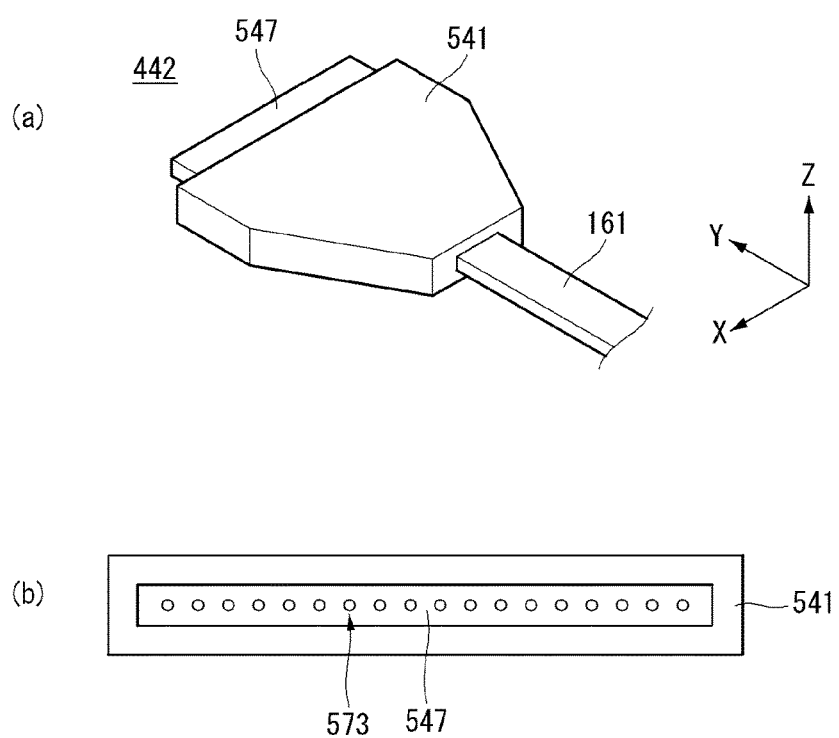

Referring to FIG. 31, the plug 442 may include a plug body 541 and a plug connector 547. The plug body 541 may have one end coupled to the flat cable 161. The width of the plug body 541 in the first direction may increase with increasing distance from the side opposite the flat cable 161. That is, the signal terminals and power terminals disposed inside of the plug body 541 can be spread wide. Accordingly, the thickness of the plug body 541 in the third direction can be reduced.

The plug connector 547 may be disposed at the other end of the plug body 541. The plug connector 547 is narrower than the plug body 541 and may have a shape protruding from the plug body 541. The plug connector 547 may be a part combined with the aforementioned body slot.

The plug connector 547 may include a plurality of connector pins 573 provided to the face combined with the body slot. The connector pins 573 may protrude forward from the plug connector 547. The plurality of connector pins 573 may be arranged at intervals. The connector pins 573 may be inserted into the connector sockets of the body slot. The positions of the connector pins 573 may correspond to the positions of the connector sockets for correct insertion. That is, intervals of the connector pins 573 can correspond to intervals of the connector sockets. Data can be transferred to the FPC board through the connector pins 573.

Referring to FIG. 32(a), the conventional display device may have a plug 23 with a uniform width. Accordingly, signal terminals and power terminals disposed inside of the plug 23 may not be spread laterally, and thus the thickness PCW of the plug 23 may be greater than the internal width of the body 10.

Therefore, the plug 23 is exposed to the outside rather than being inserted into the body 10. In this case, the appearance of the display device is not clean since a wide face of the plug 23 is exposed to the outside. In addition, the exposed plug may distract the user from the display screen.

Referring to FIG. 32(b), according to the display device according to the present invention, the width of the plug 442 in the first direction increases with increasing distance to the side opposite the flat cable 161. Accordingly, the signal terminals and power terminals of the plug 442 are spread wide. The width ICW of the plug 442 may be less than the internal width of the body 10.

Accordingly, the plug 442 can be inserted into the body 10 and thus the plug 442 is not exposed to the outside. In this case, the flat cable 161 appears to be directly coupled to the body 10. Therefore, the display device has a neat appearance and the user can concentrate on the display screen.

Figure 33:
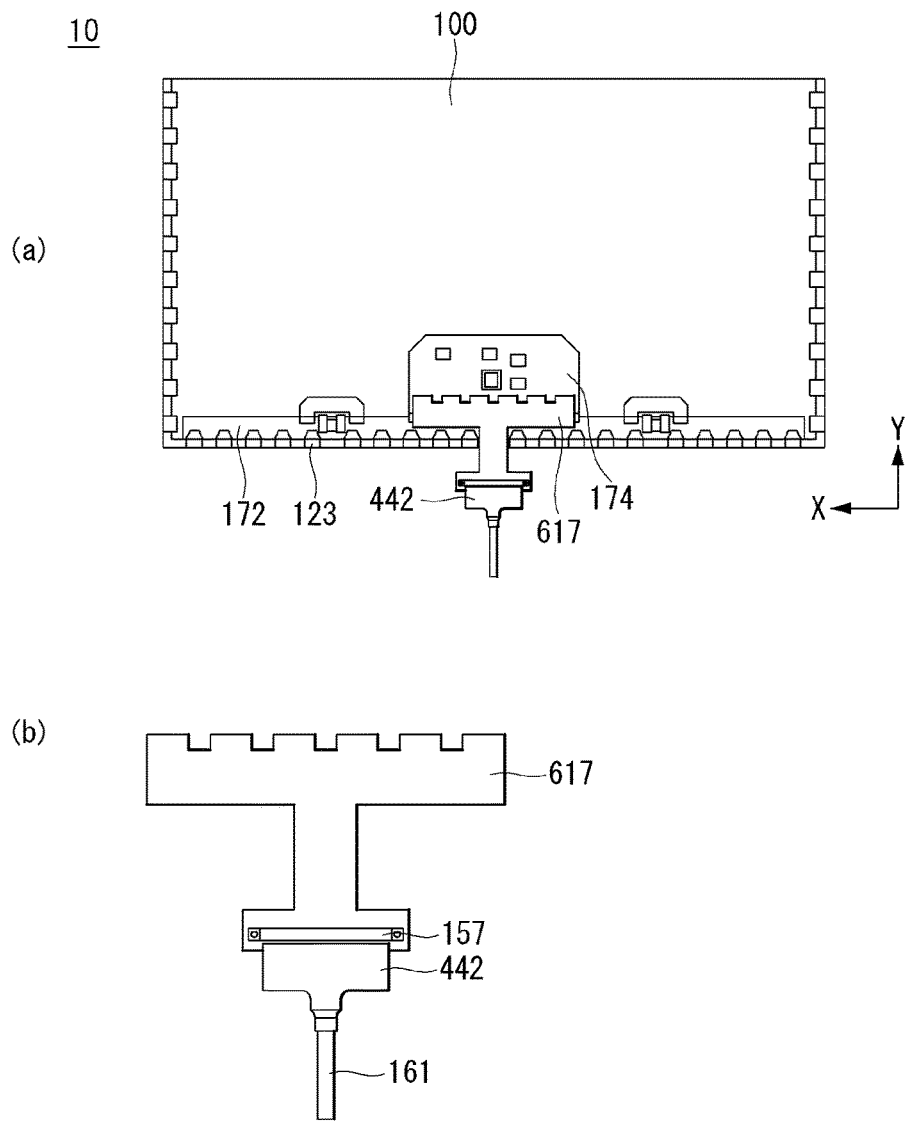

Referring to FIG. 33, in the display device according to the present invention, the FPC board 174 may be coupled to the plug 442 through a variable FPC 617. The variable FPC 617 may have functions and a structure identical or similar to the FPC board 174.

The variable FPC 617 may have a plurality of connecting portions coupled to the FPC board 174, which are disposed at one end thereof, and a connecting portion coupled to the connector 157, which is disposed at the other end thereof. The connecting portion with the connector 157 is narrower than the plurality of connecting portions. Accordingly, the variable FPC 617 can connect various types of signal terminals and power terminals to the plug 442.

The connecting portion of the variable FPC 617, which is coupled to the connector 157, may be located outside of the body 10. Accordingly, the plug 442 is not inserted into the body 10 and thus the thickness of the plug 442 can be freely set irrespective of the thickness of the body 10.

Figure 34:
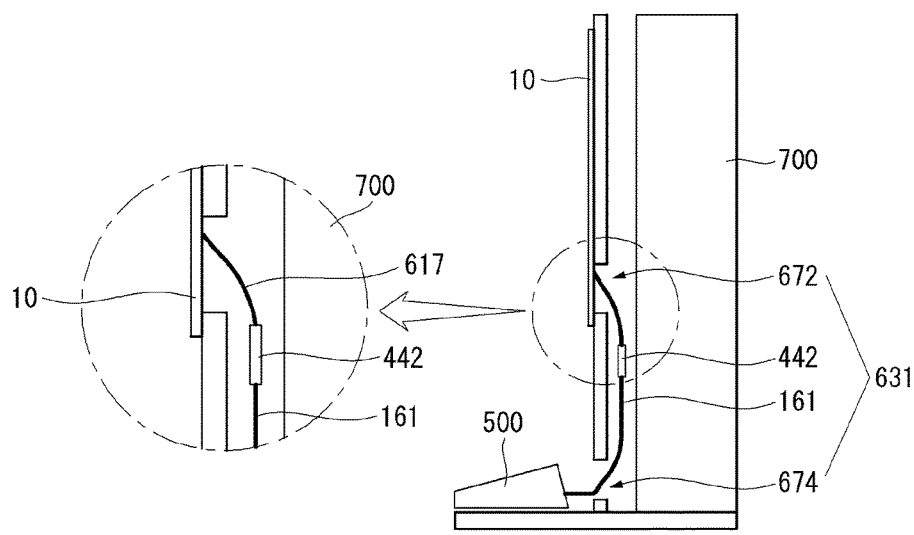

Referring to FIG. 34, according to the present invention, an empty space 631 may be provided inside the attached panel 700. The flat cable 161 can couple the body 10 and the housing 500 through the empty space 631. The empty space 631 can be formed by making a hole in the attached panel 700. However, the present invention is not limited thereto and the empty space 631 may be formed by setting a free-standing wall.

The empty space 631 includes a body penetrating part 672 corresponding to the body 10 and a housing penetrating part 674 corresponding to the housing 500 in order to couple the body 10 and the housing 500. The above description may be applied to embodiments which will be described below.

The variable FPC 672 may be bent at a part of the body 10, which is exposed to the outside. The bent variable FPC 672 may be inserted into the body penetrating part 672 to be coupled to the plug 442. The flat cable 161 extended from the plug 442 may be coupled to the housing 500 through the housing penetrating part 674.

According to the display device of the present invention, the body 10 is thin since the plug 44 is located outside of the body 10 and the appearance of the display device is clean since the thick plug 442 is located in the empty space 631.

Figure 35:
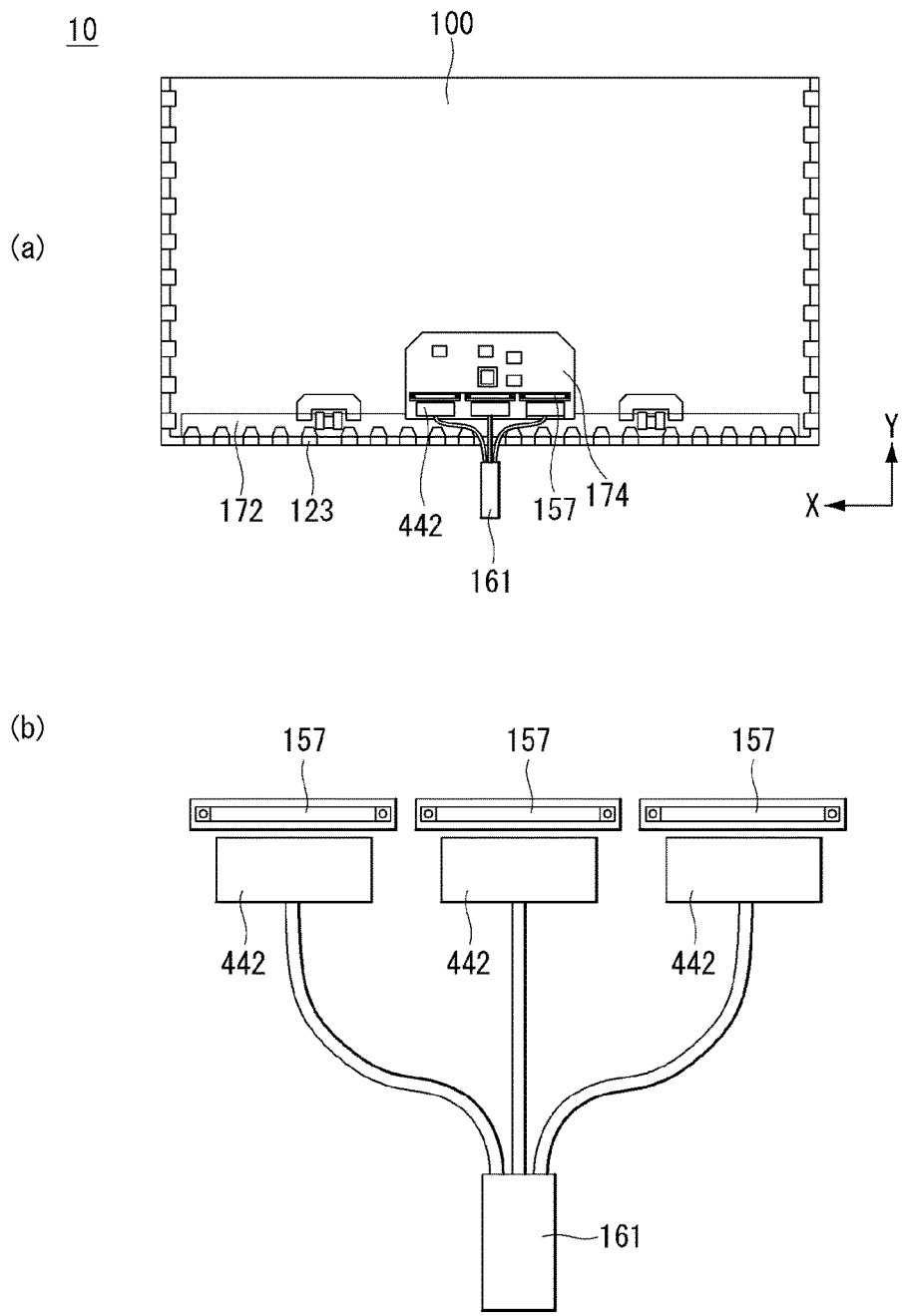

Referring to FIG. 35, the FPC board 174 may be directly coupled to a plurality of plugs 442. The plugs 442 may be connected through the connector 157 on the FPC board 174. Since the plurality of plugs 442 is directly coupled to the FPC board 174, the plugs 442 are not easily separated from the FPC board 174.

Cables coupled to the plugs 442 can be collected and connected to the one flat cable 161. The plugs 442 are located inside of the body 10 and thus are not exposed to the outside.

Figure 36:
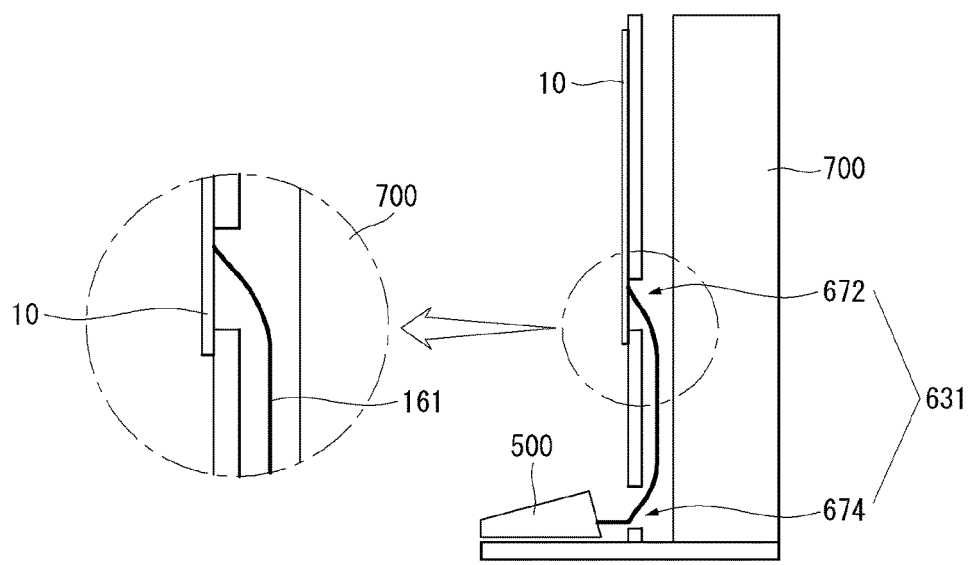

Referring to FIG. 36, the flat cable 161 can be bent at the region of the body 10 which is exposed to the outside. According to the present embodiment, the housing 500 and the body 10 are not easily separated from each other since the housing 500 and the body 10 are coupled through the flat cable 161. In addition, since the plugs are not exposed to the outside, the body 10 and the housing 500 can be easily coupled even if the empty space 631 is narrow.

Figure 37:
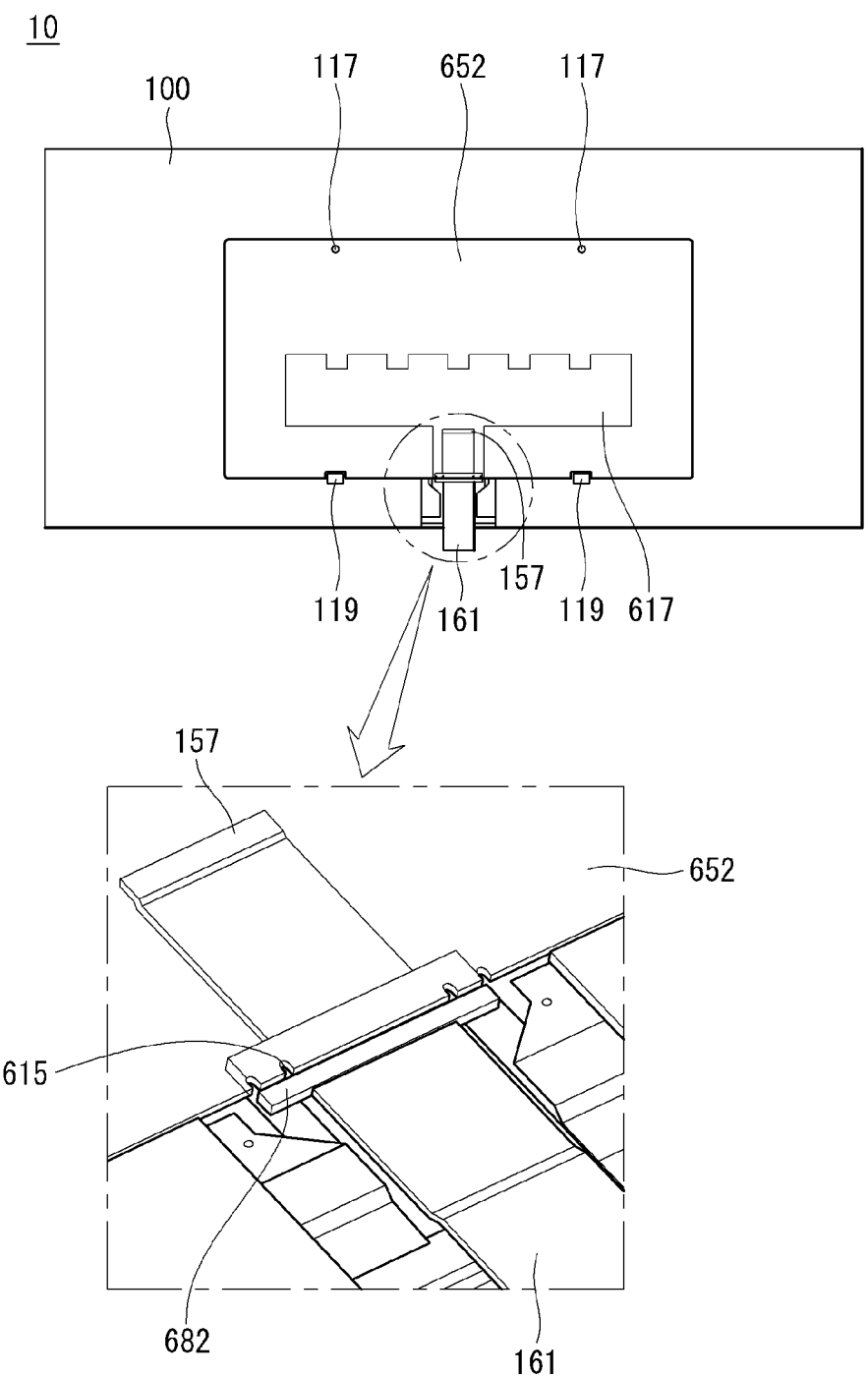

Referring to FIG. 37, the flat cable 161 may contact the variable FPC 617. The variable FPC 617 and the flat cable 161 may be coupled using the connector 157.

A cable cover 652 that shields at least part of the variable FPC 617 and the flat cable 161 may be provided to the rear side of the display panel 100. The cable cover 652 can be coupled to the display panel 100 through at least one screw 117 provided to the upper end thereof and at least one latch 119 provided to the lower end thereof.

The cable cover 652 can support the rear side of the flat cable 161. Accordingly, the cable cover 652 can prevent the flat cable 161 from being separated from the rear side of the display panel 100.

A cable stopper 682 may be provided to the center of the lower end of the cable cover 652. The cable stopper 682 may be fixed by a protrusion 615 provided to the center of the lower end of the cable cover 652. The cable stopper 682 can fix the flat cable 161. The cable stopper 682 can prevent the flat cable 161 from being vertically separated. In addition, since the cable stopper 682 fixes the flat cable 161, the flat cable 161 is not separated from the variable FPC 617 even if the flat cable 161 located at the lower end of the cable stopper 682 is bent.

Figure 38:
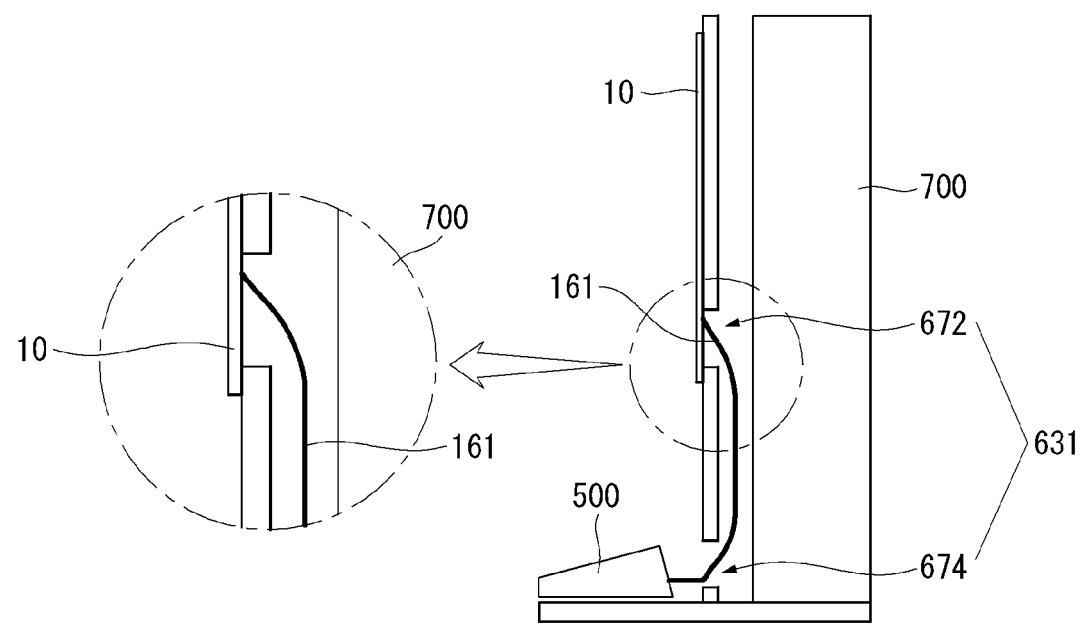

Referring to FIG. 38, the flat cable 161 may be bent at the part of the body 10 which is exposed to the outside.

According to the present embodiment, the body 10 and the flat cable 161 may not be coupled using the plug. Accordingly, the thickness of the body 10 can be reduced. In addition, the flat cable 161 may not be easily separated from the body 10 since the flat cable 161 is fixed by the cable stopper, which is not shown. The body 10 and the housing 500 can be easily connected even if the empty space 631 is narrow since the plug is not used.

Figure 39:
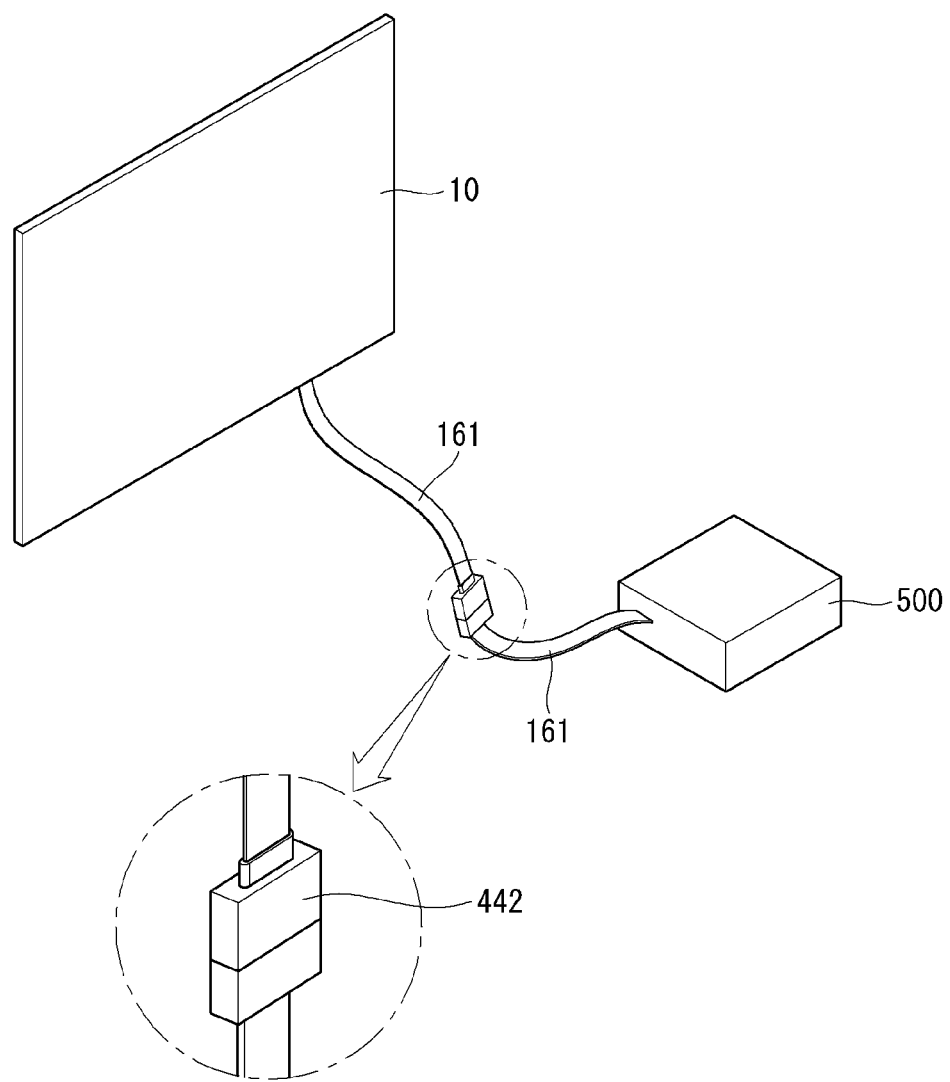

Referring to FIG. 39, when the body 10 and the housing 500 are separated by a long distance, the body 10 and the housing 500 can be connected through a plurality of flat cables 161. That is, the body 10 and the housing 500 can transfer data through the plurality of flat cables 161.

Each flat cable 161 can be coupled through the plug 442. Since the body 10 and the housing 500 are connected through the flat cables 161 only, the display device can have a neat appearance.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display unit including a display panel providing an image, a source printed circuit board (PCB) positioned on a rear surface of the display panel, and a flexible printed circuit (FPC) board positioned on the rear surface of the display panel;
a housing spaced apart from the display unit, and
a cable to electrically connect the housing with the FPC board, the cable including:
a signal line through which a video signal is carried; and
a power line through which electric power is carried, wherein the housing includes:
a main board to transmit the video signal to the display unit through the signal line;
a power supply to provide the display panel with the electric power through the power line; and
a speaker that is provided with an audio signal from the main board.

2. The display device of claim 1, wherein the housing has a length extending along a side of the display unit, and
wherein the speaker includes:
a first speaker installed at one side in a longitudinal direction of the housing; and
a second speaker installed on the other side in the longitudinal direction of the housing.

3. The display device of claim 2, wherein the first and second speakers are placed along a horizontal axis with respect to the housing.

4. The display device of claim 3, wherein the display unit includes a connector electrically connecting the source PCB with the FPC board.

5. The display device of claim 1, wherein the first and second speakers are placed symmetric with respect to a central portion of the housing.

6. The display device of claim 2, wherein the display panel includes a horizontal edge, and wherein the first and second speakers are placed alongside of the horizontal edge.

7. The display device of claim 2, wherein the display panel includes a first vertical edge and a second vertical edge opposite to the first vertical edge, wherein the first speaker is placed alongside the first vertical edge of the display panel, and wherein the second speaker is placed alongside the second vertical edge of the display panel.

8. The display device of claim 1, wherein the speaker is positioned at a front portion of the housing.

9. The display device of claim 8, wherein the speaker is positioned at a front of the main board and the power supply.

10. The display device of claim 9, wherein the speaker includes a first speaker and a second speaker, wherein the first speaker is positioned in front of the main board, and wherein the second speaker is positioned in front of the power supply.

11. The display device of claim 1, wherein one end of the cable is fixed to the FPC board.

12. The display device of claim 1, comprising a welding portion fixing the cable to the FPC board.

13. The display device of claim 1, wherein the cable and FPC board form one body.

14. The display device of claim 1, wherein the cable is not separated from the FPC board.

15. The display device of claim 1, wherein the cable is detachable from the housing.

* * * * *